United States Patent
Takemura et al.

(10) Patent No.: US 8,754,407 B2
(45) Date of Patent: Jun. 17, 2014

(54) GAS BARRIER FILM, METHOD OF MANUFACTURING GAS BARRIER FILM, AND ORGANIC PHOTOELECTRIC CONVERSION ELEMENT

(75) Inventors: Chiyoko Takemura, Tokyo (JP); Tomonori Kawamura, Tokyo (JP)

(73) Assignee: Konica Minolta Holdings, Inc., Tokyo (JP)

( * ) Notice: Subject to any disclaimer, the term of this patent is extended or adjusted under 35 U.S.C. 154(b) by 0 days.

(21) Appl. No.: 13/514,636

(22) PCT Filed: Dec. 7, 2010

(86) PCT No.: PCT/JP2010/071875
§ 371 (c)(1),
(2), (4) Date: Jun. 8, 2012

(87) PCT Pub. No.: WO2011/074440
PCT Pub. Date: Jun. 23, 2011

(65) Prior Publication Data
US 2012/0241889 A1    Sep. 27, 2012

(30) Foreign Application Priority Data
Dec. 14, 2009  (JP) ................................. 2009-282570

(51) Int. Cl.
*B32B 9/04* (2006.01)
*H01L 51/42* (2006.01)

(52) U.S. Cl.
CPC .. *B32B 9/04* (2013.01); *H01L 51/42* (2013.01)
USPC ........... 257/40; 257/E51.012; 427/74; 438/82

(58) Field of Classification Search
CPC .................................. B32B 9/04; H01L 51/42
USPC ........ 257/40, 431, E51.012; 427/508; 438/82
See application file for complete search history.

(56) References Cited

U.S. PATENT DOCUMENTS

| | | | |
|---|---|---|---|
| 7,811,669 B2 * | 10/2010 | Fujii et al. ..................... | 428/451 |
| 2003/0165696 A1 * | 9/2003 | Namiki et al. ................ | 428/446 |
| 2005/0214556 A1 * | 9/2005 | Nishimi et al. ............... | 428/500 |
| 2007/0071982 A1 * | 3/2007 | Okawara et al. ............ | 428/411.1 |
| 2007/0120119 A1 * | 5/2007 | Asabe ............................ | 257/40 |

FOREIGN PATENT DOCUMENTS

| | | |
|---|---|---|
| JP | 02-251429 | 10/1990 |
| JP | 06-124785 | 5/1994 |
| JP | 08-281861 | 10/1996 |
| JP | 2000-246830 | 9/2000 |
| JP | 2002-072177 | 3/2002 |
| JP | 2004-084027 | 3/2004 |

(Continued)

*Primary Examiner* — Allan R Wilson
(74) *Attorney, Agent, or Firm* — Lucas & Mercanti, LLP

(57) ABSTRACT

Disclosed is a gas barrier film which has both high gas barrier performance and high cracking (bending) resistance. Specifically disclosed is a gas barrier film which comprises, on a substrate in the following order, at least one silanol-containing layer and at least one gas barrier layer that contains silicon atoms and hydrogen atoms. The gas barrier film is characterized in that the relative SiOH ion strength in the central part of the silanol-containing layer in the film thickness direction as detected by time-of-flight secondary ion mass spectrometry (Tof-SIMS) is 0.02-1.0 when the relative Si ion strength is taken as 1. Also disclosed is an organic photoelectric conversion element which comprises the gas barrier film.

13 Claims, 3 Drawing Sheets

(56) References Cited

FOREIGN PATENT DOCUMENTS

| | | |
|---|---|---|
| JP | 2005-074731 | 3/2005 |
| JP | 2005-178371 | 7/2005 |
| JP | 2007-237588 | 9/2007 |
| JP | 2008-056967 | 3/2008 |
| JP | 2009-123690 | 6/2009 |

* cited by examiner

GAS BARRIER FILM, METHOD OF MANUFACTURING GAS BARRIER FILM, AND ORGANIC PHOTOELECTRIC CONVERSION ELEMENT

CROSS REFERENCE TO RELATED APPLICATION

This Application is a 371 of PCT/JP2010/071875 filed on Dec. 7, 2010 which, in turn, claimed the priority of Japanese Patent Application No. 2009-282570 filed on Dec. 14, 2009, both applications are incorporated by reference herein.

FIELD OF THE INVENTION

The present invention relates to a gas barrier film mainly used for packaging an electronic device, an organic photoelectric conversion element (a solar cell), or display materials, for example, an organic electroluminescent element (hereafter, also referred to as an organic EL element) and a plastic substrate of a liquid crystal display, and also relates to a manufacturing method thereof and an organic photoelectric conversion element employing the gas barrier film.

BACKGROUND OF THE INVENTION

A barrier film in which a thin layer of a metal oxide such as aluminum oxide, magnesium oxide, or silicon oxide is formed on the surface of a plastic substrate or a film has been widely used for packaging a product which requires blocking of various types of gases such as water vapor and oxygen or for packaging to prevent a quality change of, for example, food, industrial products or medical products.

Also, aside from the use for packaging, barrier films have been used as a substrate for liquid crystal displays, photoelectric conversion elements (also referred to as solar cells), or organic electroluminescent device substrates (also referred to as organic EL device substrates).

Aluminum foil has been widely used as a packaging material in this field, however, disposal after use is becoming a problem, and, in addition, since aluminum foil is basically an opaque material, it has the inherent problem that it is difficult to check the content from outside. Further, it is difficult to be used as a material for a solar cell which requires transparency.

Specifically, for a transparent substrate of which application to a liquid crystal display, an organic EL element or a solar cell is in progress, added has been a higher level of requirement, for example, capability of roll-to-roll production of the substrate, durability for a long duration, freedom of shape, and capability of curved display, in addition to the requirements of weight saving and a large scale. Replacement of a glass substrate, which is heavy, fragile and difficult in increasing the size with a film substrate such as a transparent plastic, is also in progress.

However, there has been a problem in that the gas barrier property of a film substrate such as a transparent plastic film is inferior to that of a glass substrate. For example, when such a substrate having an insufficient gas barrier property is used as a substrate of an organic photoelectric conversion element, water vapor or air may penetrate the substrate, which may cause degradation of the photoelectric conversion efficiency or durability due to deterioration of the organic film.

When a polymer substrate is used as a substrate of an electronic device, problems may occur that oxygen permeates the polymer substrate and soaks and spreads in an electron device to deteriorate the device, and that the degree of vacuum required in an electron device cannot be maintained.

In order to overcome such a problem, a technique to provide a thin metal oxide layer on a film substrate to obtain a gas barrier film substrate has been known. As a gas barrier film used for a packaging material or for a liquid crystal display, a plastic film on which a silicon oxide (for example, refer to Patent Document 1) or an aluminum oxide (for example, refer to Patent Document 2) is vacuum evaporated has been known.

As a method to form a film via a simple coating process, instead of a vacuum evaporation method which needs a vacuum process, there have been known several methods to form a gas barrier film composed of a converted silica film obtained by conducting a conversion treatment on a film formed by applying a coating liquid containing a silicon compound such as polysilazane (for example, refer to Patent Documents 3, 4 and 5).

Specifically, in Patent Document 4, disclosed has been a process in which a coated film of polysilazane is converted to a silica film via an oxygen plasma discharge treatment carried out under atmospheric pressure, in which formation of a gas barrier layer without using a vacuum system can be carried out.

However, the rate of water vapor permeation of the obtained film is 0.35 $g/(m^2 \cdot 24\ h)$, which cannot be said to be capable of using in a device such as described above. Generally, it is said that the rate of water vapor permeation desired for a gas barrier layer applied for an organic photoelectric conversion element is necessary to be much less than $1 \times 10^{-2}$ $g/(m^2 \cdot 24\ h)$.

Also, as a method to form a gas barrier layer via an atmospheric pressure plasma discharge method, a film forming method in which high energy density and stable plasma discharge is possible has been proposed (for example, refer to Patent Documents 6 and 7).

In above mentioned Patent Documents 6 and 7, in order to prevent cracking which occurs when a silica film having a high barrier property is formed on a flexible plastic film, such as polyethylene terephthalate (PET), a stress relaxation design has been adopted, in which the barrier layer has a distribution of carbon content along the thickness direction of the layer and the hardness of the film becomes lower when coming closer to the substrate.

However, since it is a CVD film formation method, it has been revealed that, particles are generated in the plasma space as a byproduct, and that such particles adhere to the substrate, whereby uniform film formation may suffer. It is highly possible that particles generated in such a manner become a starting point of a barrier defect. Accordingly, this method cannot be fully recommended to be a method to stably form a uniform gas barrier layer.

When a gas barrier film having a certain extent of thickness is formed on a plastic film, the silica film is extremely brittle, when a high density silica film having a uniform density (or uniform hardness) along the thickness direction of the film is formed, whereby cracking frequently occurs. Accordingly, there has been a large limitation in the handling method or in a using method, which has been a big drawback. For example, a roll-to-roll process has not been able to be used as a method of forming a gas barrier layer, shipment conveyance in the roll shape has not been possible, and, when the gas barrier layer is used in an organic photoelectric conversion element, the element cannot be used on a curved surface. These have been the problems in the manufacturing of a gas barrier film employing a roll-to-roll method under atmospheric pressure.

However, it has been desired in this technical field to realize stable manufacturing of a uniform gas barrier film which is applicable to, for example, a substrate of an organic photoelectric conversion element, while satisfying both a high gas barrier property and cracking (or bending) resistance, employing a roll-to-roll method under atmospheric pressure.

PRIOR ART TECHNICAL DOCUMENTS

Patent Documents

Patent Document 1: Japanese Patent Application Publication Open to Public Inspection (hereafter referred to as JP-A) No. 2-251429
Patent Document 2: JP-A No. 6-124785
Patent Document 3: JP-A No. 2000-246830
Patent Document 4: JP-A No. 2007-237588
Patent Document 5: JP-A No. 8-281861
Patent Document 6: JP-A No. 2004-84027
Patent Document 7: JP-A No. 2008-56967

SUMMARY OF THE INVENTION

Problems to be Solved by The Invention

An object of the present invention is to provide a gas barrier film which satisfies both a high gas barrier property and cracking (or bending) resistance, a stable manufacturing method of a uniform gas barrier film employing a roll-to-roll method carried out under an atmospheric pressure, and an organic photoelectric conversion element employing the gas barrier film.

Means to Solve the Problems

The object of the present invention is achieved by the following structure.

1. A gas barrier film comprising a substrate having thereon at least one silanol-containing layer and at least one gas barrier layer in that order, the gas barrier layer containing silicon atoms and oxygen atoms, wherein
   a relative SiOH ionic strength detected from a central portion of the silanol-containing layer with respect to the depth direction thereof is from 0.02 to 1.0, provided that a relative Si ionic strength is set to 1.0, the relative SiOH ionic strength and the relative Si ionic strength being detected via time-of-flight secondary ion mass spectroscopy (Tof-SIMS).

2. The gas barrier film of Item 1, wherein the relative SiOH ionic strength is from 0.2 to 0.8.

3. The gas barrier film of Item 1, wherein the relative SiOH ionic strength is from 0.3 to 0.6.

4. The gas barrier film of any one of Items 1 to 3, wherein the gas barrier film comprises a second gas barrier layer between the substrate and the silanol-containing layer.

5. The gas barrier film of any one of Items 1 to 4, wherein the substrate comprises a plastic film.

6. A method of manufacturing a gas barrier film of any one of Items 1 to 5, wherein the silanol-containing layer is prepared through a step of applying a liquid containing a silicon compound.

7. A method of manufacturing a gas barrier film of any one of Items 1 to 5, wherein the gas barrier layer is prepared through a step of applying a liquid containing a silicon compound.

8. A method of manufacturing a gas barrier film of any one of Items 1 to 5, wherein the silanol-containing layer or the gas barrier layer is prepared through a step of applying a liquid containing a silicon compound.

9. A method of manufacturing a gas barrier film of any one of Items 1 to 5, wherein the silanol-containing layer or the gas barrier layer is prepared via an ultraviolet light irradiation treatment carried out on a film obtained by applying a liquid containing a silicon compound from a surface side of the film obtained by applying the liquid containing the silicon compound.

10. An organic photoelectric conversion element comprising the gas barrier film of any one of Items 1 to 5.

Effect of the Invention

According to the present invention, a gas barrier film which satisfies both a high gas barrier property and a cracking (or bending) resistance property, a stable manufacturing method of a uniform gas barrier film employing a roll-to-roll method carried out under an atmospheric pressure, and an organic photoelectric conversion element employing the gas barrier film could be provided.

EMBODIMENTS TO CARRY OUT THE INVENTION

Figure 1:
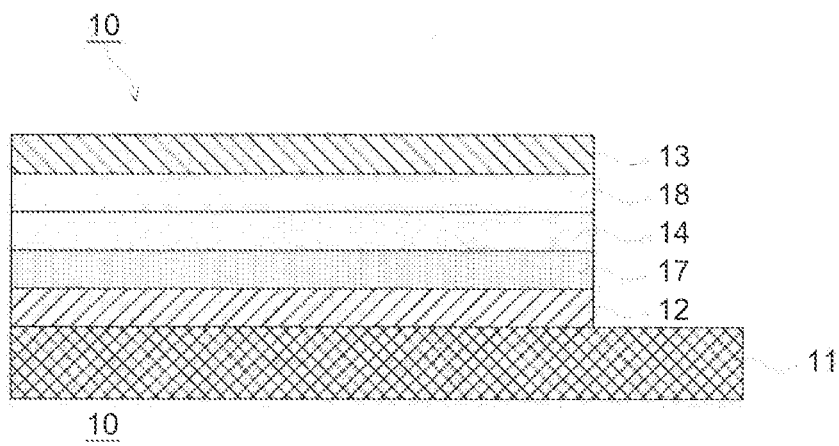
FIG. 1 is a cross-sectional figure illustrating a solar cell composed of a bulk heterojunction type organic photoelectric conversion element.

In the present invention, a gas barrier film which satisfies both a high gas barrier property and a cracking (or bending) resistance property can be provided according to the constitution described in any one of claims 1-5, a stable manufacturing method of a uniform gas barrier film employing a roll-to-roll method carried out under an atmospheric pressure can be provided according to the constitution described in any one of claims 6-8, and an organic photoelectric conversion element employing the gas barrier film can also be provided.

The present invention, the constituting elements thereof and embodiments to carry out the present invention will be explained below.

<<Gas Barrier Film (Also Referred to as Gas Barrier Nature Film)>>

The gas barrier film of the present invention will be explained.

In the present invention, a gas barrier film which satisfies both a high gas barrier property and cracking (or bending) resistance is provided by having a structure in which the gas barrier film has a substrate having thereon at least one silanol-containing layer and at least one gas barrier layer in that order, in which the gas barrier layer contains silicon atoms and oxygen atoms, wherein a relative SiOH ionic strength detected from a central portion of the silanol-containing layer with respect to the depth direction thereof is from 0.02 to 1.0, provided that a relative Si ionic strength is set to 1.0, the relative SiOH ionic strength and the relative Si ionic strength being detected via time-of-flight secondary ion mass spectroscopy (Tof-SIMS).

With respect to the gas barrier nature of the gas barrier film of the present invention, the rate of water vapor permeation measured in accordance with the method of JIS K 7129B (also referred to as degree of water vapor permeation: at 25±0.5° C., under relative humidity: 90±2% RH) is preferably $10^{-3}$ g/(m$^2$·24 h) or less, more preferably $10^4$ g/(m$^2$·24 h) or less, and specifically preferably $10^{-5}$ g/(m$^2$·24 h) or less.

The rate of oxygen permeation (also referred to as degree of oxygen permeation) measured in accordance with the method of JIS K 7126-1987 is preferably 0.01 ml/(m$^2$·0.1 MPa/day) or less and more preferably 0.001 ml/(m$^2$·0.1 MPa/day) or less.

Subsequently, each element which constitutes the gas barrier film of the present invention will be explained.

At first, the silanol-containing layer in the present invention will be explained.

<<Silanol-Containing Layer>>

The silanol-containing layer according to the present invention will be explained.

The silanol-containing layer according to the present invention preferably has a relative SiOH ionic strength detected by a time-of-flight secondary ion mass spectrometry (Tof-SIMS) in the film depth direction of 0.02-1, provided that the relative Si ionic strength is set to 1, more preferably, the relative SiOH ionic strength is 0.2-0.8, and further more preferably, the relative SiOH ionic strength is 0.3-0.6.

With respect to the silanol-containing layer according to the present invention, it is a necessary condition that the above mentioned relative SiOH ionic strength is at least 0.02 or more, and a layer of which SiOH ionic strength is less than 0.02 is not defined as a silanol-containing layer.

The relative SiOH ionic strength of 0.02-1.0 in a silanol-containing layer can be achieved by applying the adjustment method of the content of silanol group in the silanol-containing layer, which will be mentioned later.

(Inclination of Content of Silanol Group in a Silanol Layer)

The inclination of the content of silanol groups in a silanol layer means the state where the content of silanol groups which exist in a silanol-containing layer is changing in the film depth direction with regularity (it increases or decreases).

Here, the change of the content of silanol groups may be continuous or may be stepwise. Also, the silanol-containing layer may have a constant content ratio inclination throughout the thickness, or may have a portion having a constant content ratio and a portion having a constant content ratio inclination, in combination.

The content ratio inclination can be adjusted by suitably selecting a treatment method in the film forming process.

The thickness range in which the content ratio has inclination is preferably 20% or more of the thickness of a silanol-containing layer which can be formed with a single application of a coating liquid. The thickness range is more preferably 30% or more. It is specifically preferable that a content ratio inclination is formed in the thickness range of 40% or more.

(Adjustment Method of Content of Silanol Groups in Silanol Layer)

In the present invention, the content of silanol groups contained in a silanol-containing layer can be adjusted by appropriately selecting the material which forms a coated film, and a post-treatment or a conversion treatment (also referred to as an oxidation treatment) of the coated film.

For example, by keeping a polysilazane coated film under a high humidity condition for a certain period of time, the silanol conversion reaction can be intentionally promoted to prepare a silanol-containing layer having a uniform and high silanol content, or a layer constitution having a silanol content inclination along the thickness direction can be obtained by irradiating the polysilazane coated film with light from the film surface side or by conducting an atmospheric pressure plasma treatment.

Alternatively, since the reactivity of a silica conversion reaction can be controlled by appropriately adjusting the species and the amount of catalyst contained in polysilazane, it becomes possible to adjust the content ratio of silanol groups to a desired value, in combination with the above mentioned treatment.

Here, time-of-flight secondary ion mass spectrometry will be explained.

(Time-of-Flight Secondary Ion Mass Spectrometry: Tof-SIMS)

Time-of-flight secondary ion mass spectrometry is generally called Tof-SIMS (Tof-SIMS: Time-Of-Flight Secondary Ion Spectrometry). As the principle, a sample is irradiated with a pulse-like ion under high vacuum, and the ion torn off from the sample surface due to a sputtering phenomenon is detected after classifying based on weight (atomic weight or molecular weight). The chemical species (an atom or a molecule) existing on the outermost surface of the sample can be deduced from the weight and the pattern of the amount of detection (namely, a mass spectrum).

In more detail, the analysis is carried out via the following two steps.

(1) Emission of secondary ion: The solid state sample surface is irradiated with ions (primary ions) in pulses, and varieties of particles are emitted from the sample surface being subjected to ion bombardment due to a sputtering phenomenon.

Specifically, in Tof-SIMS, the current density of primary ions is suppressed at a low level (a static mode) to carry out sputtering so that damage of the sample surface is suppressed as low as possible.

(2) Mass separation and detection: The ions (secondary ions) existing in the particles emitted via sputtering are picked up and detected after classifying based on the weight (the mass), whereby a composition analysis from the surface to the interior of a sample is conducted, which is called as a secondary ion mass spectrum analysis.

In Tof-SIMS, a time-of-flight type analysis equipment is adopted for mass separation. After the ions are caught in a flight tube via an electric field, the ions fly in the flight tube, and lighter ions arrive faster at a detector and heavier ions arrive later at a detector.

This time of flight is converted into mass to conduct mass separation. The use of a time-of-flight type analysis equipment enables a high sensitivity, high mass resolution, and high mass value detection.

By using this method, not only a two dimensional distribution of chemical species existing on the surface can be determined, but also a compositional analysis of elements along the depth direction of the sample of a shallow region can be conducted by repeatedly digging the surface with an ion beam. Further, determination of relative existing amounts of detected ions can be carried out.

(Method to Determine Relative SiOH Ionic Strength)

Subsequently, a method to determine a relative SiOH ion strength according to the present invention will be explained.

As described above, the SiOH ionic strength of the present invention can be obtained by using time-of-flight secondary ion mass spectrometry.

The SiOH ionic intensity or SiOH ionic intensity of the present invention is obtained as an average value of each detected ionic strength obtained by measuring in the depth direction of a silanol-containing layer at two-dimensionally randomly selected two points.

Further, the relative SiOH ionic strength according to the present invention is obtained as a value of relative SiOH ionic strength when relative Si ionic strength is normalized to 1.

As mentioned above, in Tof-SIMS, the analysis along the depth direction from the surface is possible by using sputtering by ion (Ar, Xe) irradiation in combination.

Measurement along the film depth direction of a silanol-containing layer is performed by repeating sputtering and measurement at a certain interval until the substrate adjoining the silanol-containing layer or another layer adjoining the silanol-containing layer on the substrate side is exposed while using the outermost surface free from contamination or foreign substance as a starting point.

As a measuring interval, 30 seconds-3 minutes as a sputtering time is adopted, however, the measuring interval is preferably 30 seconds-1 minute, since the measuring interval is preferably as short as possible.

Since it is difficult to obtain a reliable result from the outermost surface due to the effect of adsorbed water or other adsorbed substance, the value obtained after 2 minutes from start sputtering is used as a value from the outermost surface, and as a terminal point of the silanol-containing layer (namely, the interface between the substrate or between an adjoining layer on the substrate side), adopted is the point which is one point before the point at which a component originated from the substrate adjoining the silanol-containing layer or another layer adjoining the silanol-containing layer on the substrate side (for example, c ions when a plastic substrate is used) begins to be drastically detected (by several orders of magnitude).

The measured values at the above mentioned outermost surface and the terminal point on the substrate side of the silanol-containing layer are designated as the values detected along the depth direction of the silanol-containing layer, and the ionic strengths at these points are used as the ionic strength according to the present invention.

In the present invention, a relative SiOH ionic strength detected via time-of-flight secondary ion mass spectrometry (Tof-SIMS) at the central portion of the layer in the depth direction of a silanol-containing layer is determined. Here, "at the central portion of the layer" specifically means that the measurement is conducted at a depth of 100 nm±10 nm (namely, ±5% based on the layer thickness) from the surface of the silanol-containing layer when the layer thickness of the silanol-containing layer is 200 nm.

When a film component has distribution in the depth direction of the film and a composition of the film is not uniform, the sputtering rate (namely, thickness per unit time at which sputtering is carried out) may not be exactly constant, however, in the present invention, the above mentioned method would not cause a problem since it is not necessary to exactly specify the central portion of the layer in the present invention.

By providing a silanol-containing layer according to the present invention between a substrate and a gas barrier layer, the resistance for bending the gas barrier film of the present invention can be significantly improved.

Namely, the following excellent effects can be obtained, for example, a high gas barrier property can be maintained even when a gas barrier film is manufactured via a roll-to-roll method and shipped and conveyed in a roll form, and, when a gas barrier film is used for a device such as an organic photoelectric conversion element, the device can be equipped on a curved surface.

The content of silanol groups contained in a silanol-containing layer may be made constant throughout the layer or may be made to have inclination along the depth direction of the layer.

Specifically, a resistance for bending the film is expected to be improved by providing a higher content of silanol groups in the region closer to the substrate and providing a lower content of silanol groups in the region closer to the gas barrier film due to enhanced stress-relaxation function.

Next, the gas barrier layer according to the present invention will be explained.

<<Gas Barrier Layer (Layer which has Gas Barrier Property)>>

The gas barrier layer according to the present invention is a layer (also called as a film) which contains silicon atoms and oxygen atoms as constituting atoms, and prevents the permeation of oxygen or water vapor.

As a material which constitutes a gas barrier layer, an inorganic oxide which has silicon is specifically preferred, and a layer which has, for example, silicon oxide or silicon nitride oxide may be cited.

At first, the method of manufacturing the gas barrier layer according to the present invention will be explained.

(Method of Manufacturing Gas Barrier Layer)

As the method of manufacturing a gas barrier layer according to the present invention, it is preferred that, after applying a solution containing a silicon compound onto a surface to be provided with a film, the applied layer is subjected to a light irradiation treatment or a plasma treatment under an oxidizing gas atmosphere.

The light irradiation treatment or the plasma treatment carried out under an oxidizing gas atmosphere is more preferably conducted in combination with a heat treatment.

With respect to the plasma treatment carried out under an oxidizing gas atmosphere, methods known in the art such as a vacuum oxygen plasma method are applicable, however, it is preferable that an atmospheric pressure plasma method be used.

The layer formation via application of a solution containing a silicon compound, formation of a gas barrier layer via an oxidation treatment (also referred to as a conversion treatment) of the layer, and, subsequently, the feature of the obtained gas barrier layer will be explained, in turn, below.

(Preparation of Solution Containing Silicon Compound and Formation of Coated Film (Applied Film) Via Application)

The preparation of a solution containing a silicon compound and the formation of a coated film via application of the solution according to the present invention will be explained.

In the preparation of a solution containing a silicon compound according to the present invention, a solvent which tends not to contain water, for example, xylene, dibutylether, solvesso or turpentine is preferably employed in order to avoid the reaction of water with the solution while being applied.

As a method to apply the solution containing a silicon compound, an arbitrary and suitable method may be employed, examples of which include a spin coat method, a roll coat method, a flow coat method, an inkjet method, a spray coat method, a printing method, a dip coating method, a casting film formation method, a bar coat method and a gravure printing method.

The coated film (applied film) formed by applying the solution containing a silicon compound is subjected to a conversion treatment (also referred to as an oxidizing treatment) which will be described later, whereby the silicon compound is converted to a silicon dioxide to form a gas barrier layer.

Specifically, for example, Aquamica NN120, NN110, NAX120, NN310, NN320, NL110A, NL120A, NL150A, NP110, NP140 and SP140, produced by AZ Electronic Materials may be cited.

In a preferable embodiment, the coated film is annealed in order to obtain a uniform dried film after the solvent is removed. The annealing temperature is preferably 60° C.-200° C. and more preferably 70° C.-160° C. The duration of annealing is preferably 5 seconds—around 24 hours and more preferably 10 seconds—around 2 hours.

A uniform coated layer can be stably obtained by conduct annealing in the above described range before conducting a conversion treatment which is followed by the subsequent step.

Further, annealing may be conducted at a constant temperature, the temperature may be changed stepwise, or the temperature may be changed continuously (increasing temperature and/or decreasing temperature). While annealing, in order to stabilize the reaction, humidity is preferably adjusted, and the humidity is normally from 30% RH to 90% RH, and more preferably from 40% RH to 80% RH.

Subsequently, silicon compounds will be explained.
(Silicon Compound)

The silicon compounds according to the present invention will be explained.

The silicon compound according to the present invention is not specifically limited as far as it enables preparation of a coating liquid containing a silicon compound, however, a polysilazane compound or a polysiloxane is preferably used.

Here, silicon dioxide (namely, $SiO_2$ (also referred to as silica)) is not included an the silicon compound according to the present invention.

Examples of a preferable silicon compound according to the present invention include: perhydro-polysilazane, silsesquioxane, tetramethylsilane, trimethylmethoxysilane, dimethyldimethoxysilane, methyltrimethoxysilane, trimethylethoxysilane, dimethyldiethoxysilane, methyltriethoxysilane, tetraethoxysilane, tetramethoxysilane, hexamethyldisiloxane, hexamethyldisilazane, 1,1-dimethyl-1-silacyclobutane, trimethylvinylsilane, methoxydimethylvinylsilane, trimethoxyvinylsilane, ethyltrimethoxysilane, dimethyldivinylsilane, dimethylethoxyethynylsilane, diacetoxydimethylsilane, dimethoxymethyl-3,3,3-trifluoropropylsilane, 3,3,3-trifluoropropyltrimethoxysilane, aryltrimethoxysilane, ethoxydimethylvinylsilane, arylaminotrimethoxysilane, N-methyl-N-trimethylsilylacetamide, 3-aminopropyltrimethoxysilane, methyltrivinylsilane, diacetoxymethylvinylsilane, methyltriacetoxysilane, aryloxydimethylvinylsilane, diethylvinylsilane, butyltrimethoxysilane, 3-aminopropyldimethylethoxy silane, tetravinylsilane, triacetoxyvinylsilane, tetraacetoxysilane, 3-trifluoroacetoxypropyltrimethoxysilane, diaryldimethoxysilane, butyldimethoxyvinylsilane, torimethyl-3-vinylthiopropylsilane, phenyltrimethylsilane, dimethoxymethylphenylsilane, phenyltrimethoxysilane, 3-acryloxypropyldimethoxymethylsilane, 3-acryloxypropyltrimethoxysilane, dimethylisopentyloxyvinylsilane, 2-aryloxyethylthiomethoxytrimethylsilane, 3-glycidoxypropyltrimethoxysilane, 3-arylaminopropyltrimethoxysilane, hexyltrimethoxysilane, heptadecafluorodecyltrimethoxysilane, dimethylethoxyphenylsilane, benzoykoxytrimethylsilane, 3-methacryoxypropyldimethoxymethylsilane, 3-methacryloxypropyltrimethoxysilane, 3-isocyanatepropyltriethoxysilane, dimethylethoxy-3-glycidoxypropylsilane, dibutoxydimethylsilane, 3-butylaminopropyltrimethylsilane, 3-dimethylaminopropyldiethoxymethylsilane, 2-(2-aminoethylthioethyl)triethoxysilane, bis(butylamino)dimethylsilane, divinylmethylphenylsilane, diacetoxymethylphenylsilane, dimethyl-p-tolylvinylsilane, p-styryltrimethoxysilane, diethylmethlylphenylsilane, benzyldimethylethoxysilane, diethoxymethylphenylsilane, decylmethyldimethoxysilane, diethoxy-3-glycidoxypropyplmethylsilane, octyloxytrimethylsilane, phenyltrivinylsilane, tetraaryloxysilane, dodecyltrimethylsilane, diarylmethylphenylsilane, diphenylmethylvinylsilane, diphenylethoxymethylsilane, diacetoxydiphenylsilane, dibenzyldimethylsilane, diaryldiphenylsilane, octadecyltrimethylsilane, methyloctadecyldimethylsilane, docosylmethyldimethylsilane, 1,3-divinyl-1,1,3,3-tetramethyldisiloxane, 1,3-divinyl-1,1,3,3-tetramethyldisilazane, 1,4-bis(dimethylvinylsilyl)benzene, 1,3-bis(3-acetoxypropyl)tetramethyldisiloxane, 1,3,5-trimethyl-1,3,5-trivinylcyclotrisiloxane, 1,3,5-tris(3,3,3-trifluoropropyl)-1,3,5-trimethylcyclotrisiloxane, octamethylcyclotetrasiloxane, 1,3,5,7-tetraethoxy-1,3,5,7-tetramethylcyclotetrasiloxane, and decamethylcyclopentasiloxane.

Of these, a silicon compound which is solid state at a normal temperature is preferably used, and perhydropolysilazane (PHPS), or silsesquioxane is more preferably used.

Examples of silsesquioxane include Q8 series compounds produced by Mayaterials, Inc., for example, Octakis (tetramethylammonium)pentacyclo-octasiloxane-octakis (yloxide) hydrate; Octa (tetramethylammonium) silsesquioxane, Octakis (dimethylsiloxy) octasilsesquioxane, Octa[[3-[(3-ethyl-3-oxetanyl)methoxy]propyl]dimethylsiloxy]octasilsesquioxane; Octaallyloxetane silsesquioxane, Octa[(3-propylglycidylether)Dimethylsiloxy]Silsesquioxane; Octakis [[3-(2, 3-epoxypropoxy) propyl]dimethylsiloxy] octasilsesquioxane, Octakis[[2-(3 4-epoxycyclohexyl)ethyl] dimethylsiloxy]octasilsesquioxane, Octakis[2-(vinyl) dimethylsiloxy]silsesquioxane; Octakis (dimethylvinylsiloxy) octasilsesquioxane, Octakis[(3-hydroxypropyl)dimethylsiloxy]octasilsesquioxane, Octa [(methacryloylpropyl)dimethylsilyloxy]silsesquioxane and Octakis[(3-methacryloxypropyl)dimethylsiloxy]octasilsesquioxane. Further, compounds having the following constitutional formulas may be cited.

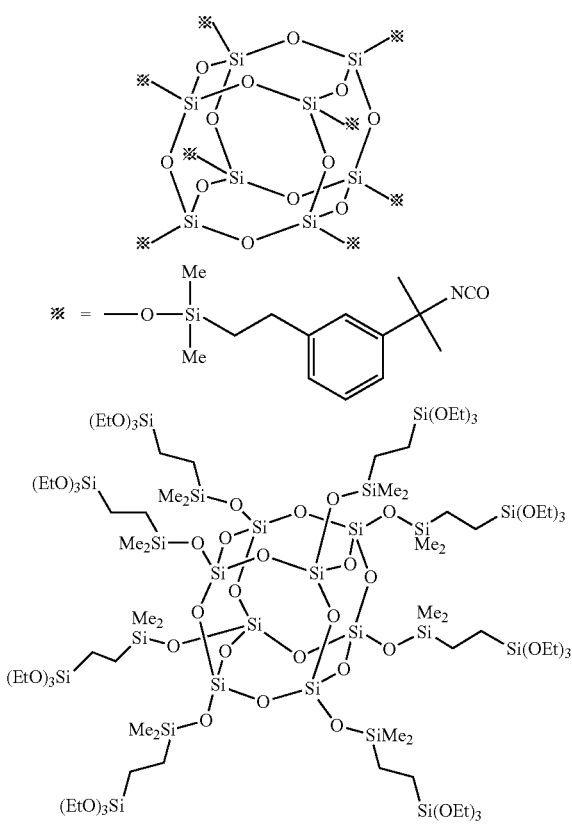

(Formation of Gas Barrier Layer)

The gas barrier layer according to the present invention is formed by carrying out conversion treatment (or an oxidation treatment) on the coated film containing the above mentioned silicon compound. As a conversion treatment, methods to conduct a light irradiation treatment or a plasma treatment under an oxidizing atmosphere are preferably used.

In the following sections, an atmospheric pressure plasma treatment which is one of the preferable embodiments among the plasma treatments applied for the conversion treatment (or an oxidizing treatment) will be explained, and, subsequently, a light irradiation treatment will be explained.

(Atmospheric Pressure Plasma Treatment)

The atmospheric pressure plasma treatment which is preferably used for forming a gas barrier layer according to the present invention will be explained.

In the case of the atmospheric pressure plasma treatment, nitrogen gas and/or an element of the 18th group in the periodic table, in more concretely, helium, neon, argon, krypton, xenon or radon is preferably used as a discharge gas. An oxidation reaction can be promoted by supplying oxygen having an oxidizing nature as a reaction gas. Of these, nitrogen, helium and argon are preferably used, and, specifically, nitrogen is most preferably used also in view of the low cost.

A reaction gas used for the atmospheric pressure plasma treatment can be selected according to a purpose, and a hydrogen gas, a nitrogen gas, an oxygen gas or water vapor is preferably used, and a hydrogen as or an oxygen gas is more preferably used.

With respect to the atmospheric pressure plasma treatment in the present invention, concretely, it is preferable that two or more electric fields having different frequencies are applied in the discharge space by applying an electric field obtained by superposing a first high frequency electric field and a second high frequency electric field as disclosed in WO 2007/026545 pamphlet.

The frequency of the aforementioned second high frequency electric field ω2 is higher than the frequency of the aforementioned first high frequency electric field ω1, the relationship among the strength of the first high frequency electric field V1, the strength of the second high frequency electric field V2 and the strength of the discharge initiating electric field IV meets $$V1 \geq IV > V2 \text{ or } V1 > IV \, V2,$$

and the power density of the second high frequency electric field is 1 W/cm² or more.

By employing such an electric discharge condition, for example, even nitrogen gas having a high discharge initiating electric field can initiate discharge, a high density and stable plasma state can be maintained, and highly efficient thin film formation can be carried out.

When nitrogen is used as a discharge gas by the above-mentioned measurement, the strength of a discharge initiating electric field IV (½Vp-p) is around 3.7 kV/mm. Nitrogen gas is excited to cause a plasma state by applying an electric field of which the strength of the first high frequency electric field meets V1≥3.7 kV/mm in the above-mentioned relationship.

Here, as the frequency of the first power source, 200 kHz or less is preferably used. Further, the wave shape of the electric field may be a continuous wave or a pulse wave. The lower limit is preferably 1 kHz or less.

On the other hand, as the frequency of the second power source, 800 kHz or more is preferably used. The higher the frequency of the second power source is, the higher the density of the plasma is, whereby a dense and high quality thin film can be obtained. The higher limit is preferably around 200 MHz.

Regarding application of high frequency electric fields from such two electric sources, the first high frequency electric field is necessary to start the electric discharge of a discharge gas which require a high strength of discharge initiating electric field, and a dense and high quality thin film can be obtained due to a high plasma density caused by the high frequency and the high power density of the second high frequency electric field.

Next, preferable embodiments of the light irradiation treatment will be explained.

<<Light Irradiation Treatment>>

In the light irradiation treatment according to the present invention, the light used for the light irradiation treatment under an oxidizing treatment gas atmosphere is preferably ultraviolet light. Via irradiation of ultraviolet light, active oxygen and ozone are generated. These active oxygen and ozone further promote the oxidizing reaction.

The reactivity of these active oxygen and ozone is extremely high, for example, when polysilazane is chosen as a silicon compound, a coated film of polysilazane which is a precursor of a silicon oxide is directly oxidized without going through silanol, whereby a higher density silicon oxide film containing fewer defects can be formed.

As a method to compensate the insufficiency of reactive ozone with a method other than irradiation of light, ozone may be generated by a method known in the art, for example, via discharge, to introduce the ozone into an ultraviolet light irradiating portion.

The wavelength of ultraviolet light used for this purpose is not specifically limited, however, it is preferably 100 nm-450 nm. It is more preferable that vacuum ultraviolet light having a wavelength of 150 nm to about 300 nm is used.

As a light source, for example, a low pressure mercury lamp, a deuterium lamp, a xenon excimer lamp, a metal halide lamp and an excimer laser are usable. The output power of a lamp is preferably from 400 W to 30 kW. The illumination intensity is preferably from 100 mW/cm$^2$ to 100 kW/cm$^2$. The illumination energy is preferably from 10 mJ/cm$^2$ to 5000 mJ/cm$^2$, and more preferably from 100 mJ/cm$^2$ to 2000 mJ/cm$^2$. The illumination intensity of ultraviolet light illumination is preferably from 1 mW/cm$^2$ to 10 W/cm$^2$.

Of these, vacuum ultraviolet light of which wavelength is from 100 nm to 200 nm is most preferably used, whereby an oxidizing reaction can be carried out at a lower temperature in a shorter time. As a light source, a rare gas excimer lamp, such as a xenon excimer lamp, is most preferably used.

By irradiating a coated film of polysilazane with ultraviolet light under an oxidizing gas atmosphere, the polysilazane is converted to a high density silicon oxide film, namely, a high density silica film. The film thickness and the density of the silica film can be controlled by the intensity, irradiation time and wavelength of the ultraviolet light, which are appropriately selected by selecting the kind of a lamp to obtain a desired film structure. Also, plural times of irradiation may be conducted instead of continuous irradiation, in which the plural times of irradiation may be of short time irradiation or pulse irradiation.

Heating the coated film simultaneously with ultraviolet light irradiation is also preferably conducted to promote the reaction (namely, an oxidizing reaction or a conversion treatment). As a method of heating, for example, a method to heat the coated film by contacting the substrate with a heating element such as a heat block to heat the coated film via thermal conduction; or a method to use light of an infrared region such as an IR heater; may be cited, however, the method is not specifically limited. A method in which flatness of the coated film can be maintained may be arbitrarily selected.

The heating temperature is preferably in the range of 500° C. to 200° C., and more preferably in the range of 80° C. to 150° C. The heating duration is preferably in the range of 1 second to 10 hours, and more preferably in the range of 10 seconds to 1 hour.

(Feature of Gas Barrier Film)

The feature of the gas barrier film according to the present invention will be explained.

The thickness of the gas barrier layer is preferably in the range of 30 nm to 2000 nm, more preferably in the range of 40 nm to 500 nm, and specifically preferably in the range of 40 nm to 300 nm, in order to effectively avoid deterioration of the barrier property or generation of cracks due to a foreign substance or protrusion on the film forming surface.

The gas barrier layer according to the present invention may be constituted of a single layer or a plurality of similar layers, and by providing a plurality of layers, the gas barrier property can be improved.

With respect to a gas barrier layer and a silanol-containing layer, the gas barrier layer and the silanol layer may be simultaneously formed with one film formation by, for example, conducting a treatment in which a solution containing a silicon compound is applied to form one layer, followed by conducting a conversion treatment (or an oxidizing treatment) to a gas barrier layer only of the surface of the located layer while adjusting so that silanol groups are left in interior of the film.

Further, it is also possible to have a constitution in which gas barrier layers and silanol-containing layers are alternatively laminated.

Of these, with respect to the gas barrier film of the present invention, it is preferable to have a constitution in which a second gas barrier layer is provided between the substrate and the silanol-containing layer.

Here, a second gas barrier layer will be explained.

<<Second Gas Barrier Layer>>

The second gas barrier layer according to the present invention will be explained.

The second gas barrier layer according to the present invention is at least one layer which is provided between a substrate and a silanol-containing layer.

The second gas barrier layer according to the present invention may be formed with a similar material, constitution and forming method to those mentioned above.

By providing a second gas barrier layer, for example, an effect to prevent deterioration due to aging under a high temperature condition can be obtained, since the silanol-containing layer is sandwiched between two films each having a high gas barrier property (namely, a gas barrier property against water vapor or oxygen), whereby the durability of the gas barrier layer is improved.

With respect to the deterioration due to aging under a high temperature condition, it is afraid that deterioration due to aging under a high temperature condition may occur, since, for example, silanol groups in the silanol-containing layer tends to cause a dehydration-condensation reaction.

On the other hand, decrease in the content of silanol groups may be relatively suppressed when polysilazane of non-catalyst type is used as a silicon compound, since heat energy of 450° C. or more is necessary for silanol groups to conduct a dehydration-condensation, accordingly, this reaction hardly occurs. However, the deterioration due to aging under a high temperature condition can be further suppressed by providing a second gas barrier layer.

Further, the surface energy of a substrate surface may become a problem with respect to a coating property. Accordingly, an adhering property of the substrate surface with a film formed thereon and a coating property are important factors, since a poor coating property may largely affect the gas barrier property. A surface obtained by providing a second gas barrier layer is preferred, for example, because an effect to improve the adhering property or a coating property can be expected.

<<Substrate>>

The substrate according to the gas barrier film of the present invention will be explained.

The substrate according to the gas barrier film of the present invention is not specifically limited as far as it is formed by a material which can support the aforementioned silanol-containing layer or the second gas barrier layer. The substrate according to the present invention is preferably an organic substrate, namely, a plastic film, having a smooth layer.

Examples of a plastic film include plastic films of such as an acrylic acid ester, a methacrylic acid ester, polyethylene terephthalate (PET), polybutylene terephthalate, polyethylenenaphthalate (PEN), polycarbonate (PC), polyallylate, polyvinyl chloride (PVC), polyethylene (PE), polypropylene (PP), polystyrene (PS), nylon (Ny), aromatic polyamide, polyether ether ketone, polysulfone, polyethersulfone, polyimide, and polyetherimido, a heat-resistant transparent film containing silsesquioxane having an organic-inorganic hybrid structure as a basic skeleton (product name Sila-DEC™, produced by Chisso Corp.), and plastic films having two or more laminated layers of above mentioned plastics.

With respect to the cost or the ease of acquisition, for example, polyethylene terephthalate (PET), polybutylene terephthalate and polyethylenenaphthalate (PEN), polycarbonate (PC) are preferably used. Alternatively, with respect to optical transparency, heat resistance and adherence with an inorganic layer or a gas barrier layer, a heat resistant transparent film containing silsesquioxane having an organic-inorganic hybrid structure as a basic skeleton may be preferably used.

The thickness of the substrate according to the present invention is preferably 5 μm-500 μm and more preferably 25 μm-250 μm.

Further, the substrate according the present invention is preferably transparent. It is because, when the substrate is transparent and the layer formed on the substrate is also transparent, a transparent barrier film can be obtained, whereby it is possible to use the barrier film as a transparent substrate of, for example, a photoelectric conversion element (or a solar cell).

A substrate being transparent means that the transmittance of visible light (wavelengths of 400 nm-700 nm) is 80% or more.

The plastic film employing, for example, an above mentioned plastic film may be a stretched film or a non-stretched film.

The plastic film substrate used in the present invention can be produced by a common method well-known in the art. For example, by melting a plastic used as a material in an extruding apparatus, and by extruding the melt through a tubular die or a T-die to quench the melt, a substantially amorphous, non-oriented and non-stretched substrate can be obtained.

Also, a stretched substrate may be produced by stretching a non-stretched substrate in a film conveyance direction (a longitudinal direction) or a direction perpendicular to the film conveyance direction (a transverse direction) via uniaxial stretching, sequential biaxial stretching via a tenter method, simultaneous biaxial stretching via a tenter method or simultaneous biaxial stretching via a tubular method. The stretching ratio in this case is preferably 2-10 times in each of the longitudinal axis direction and the transverse axis direction, although the stretching ratio may be appropriately selected in accordance with the resin as a raw material of the substrate.

Further, for a plastic film according to the present invention, before providing a film, a surface cleaning treatment and a hydrophobic treatment via a corona treatment or a UV ozone treatment are preferably conducted to improve the adhesiveness and the coating property of the formed film against the substrate surface.

Furthermore, an anchor coat agent layer may be provided on the substrate surface according to the present invention for the purpose of improving adhesiveness with a silanol-containing layer or a second gas barrier layer.

Examples of an anchor coat agent used for the anchor coat agent layer include a polyester resin, an isocyanate resin, an urethane resin, an acrylic resin, an ethylene vinyl alcohol resin, a modified vinyl resin, an epoxy resin, a modified styrene resin, a modified silicon resin, and alkyltitanate, which may be used alone or in combination of two or more kinds thereof.

A conventionally well-known additive agent can also be added to these anchor coat agents. The anchor coating may be conducted by applying an anchor coating agent such as described above on a plastic film via a method known in the art, for example, a roll coat method, a photogravure coat method, a knife coat method, a dip coat method, and a spray coat, followed by drying to remove such as a solvent or a dilution agent.

The applying amount of the anchor coating agent as aforementioned is preferably around 0.1 to 5 $g/m^2$ (under a dried condition).

The substrate used in the present invention may be a film having a gas barrier nature (for example, an aluminum foil, or an extremely thin flexible glass sheet). By using such a substrate, it is possible for the substrate to cover the function of a second gas barrier layer by itself.

(Smooth Layer)

The smooth layer of the present invention is provided in order to flatten the crude surface of a transparent resin film having protrusions or to flatten the transparent inorganic layer having asperity or pinholes due to the protrusions existing on the transparent resin film substrate. Such a smooth layer is basically formed by hardening a photosensitive resin.

As a photosensitive resin used for a smooth layer, cited may be, for example, a resin composition containing an acrylate compound having a radically reactive unsaturated compound, a resin composition containing a mercapto compound having an acrylate compound and a thiol group, and a resin composition in which dissolved is a multifunctional acrylate monomer such as an epoxy acrylate, an urethane acrylate, a polyester acrylate, a polyether acrylate, a polyethyleneglycol acrylate, or glycerol methacrylate. Further, it is also possible to use an arbitrary mixture of the above resin composites. The photosensitive resin is not specifically limited as far as it contains a reactive monomer having one or more photopolymerizable unsaturated bond in the molecule.

The photosensitive resin composition may contain a photo polymerization initiator.

The method of forming a smooth layer is not specifically limited, however, preferably employed are wet methods, for example, a spin coating method, a spray coating method, a blade coating method, and a dip coating method, and dry coating methods, for example, a vacuum evaporation method.

In the smooth layer forming process, an additive such as an antioxidant, an ultraviolet absorber or a plasticizer may be added in the aforementioned photosensitive resin, if needed. An appropriate resin or an additive may be added in any smooth layer irrespective of the laminate position in order to improve the film forming property or to avoid occurrence of pin holes.

The flatness of a smooth layer is a value expressed by the surface roughness, and the maximum profile peak height Rt (p) is preferably 10 nm or more, but 30 nm or less. When the Rt(p) value is smaller than this range, the coating property may be lost in the step of applying a silicon compound, which will be described later, in the occasion when a coating means becomes in contact with the smooth layer in a coating method such as a wire bar method or a wireless bar method. Or, when the Rt(p) value is smaller than this range, it may become difficult to smooth the irregularity after applying a silicon compound.

The surface roughness is calculated from a cross-sectional curve of the irregularity obtained by a continuous measurement using a detector having a stylus of the minimal tip radius in an atomic force microscope (AFM), which is a roughness relating the amplitude of minute irregularity obtained by multiple measurements within a range of several tens μm using a stylus of the minimal tip radius.

(Additive to Smooth Layer)

One of the preferable embodiments is that the aforementioned photosensitive resin contains reactive silica particles on the surfaces of which photosensitive groups having a photopolymerizable reactivity are introduced (hereafter, also referred to merely as reactive silica particles).

As a photosensitive group which has a photopolymerization property, for example, cited is a polymerizable unsaturated group which is represented by (meth)acryloyloxy group. The photosensitive resin may contain a compound which enables a photopolymerization reaction with a photosensitive group having a photopolymerizing reactivity, which is introduced on the surfaces of reactive silica particles, for example, an unsaturated organic compound having a polymerizable unsaturated group.

Further, as a photosensitive resin, a composition of which solid content is adjusted by appropriately mixing a commonly used diluting solvent with such reactive silica particles or an unsaturated organic compound having a polymerizable unsaturated group.

The average diameter of the reactive silica particles is preferably from 0.001 µm to 0.1 µm. By adjusting the average particle diameter within such a range, a smooth layer having the following property becomes easier to obtain, namely, a smooth layer having both an optical property in which an anti-glare property and resolution are satisfied in a good balance, which is an effect of the present invention, and a hard-coat property.

In view of obtaining such an effect more easily, it is more preferable to use reactive silica particles having an average particle diameter of 0.001 µm to 0.01 µm.

The aforementioned inorganic particles are preferably contained in the smooth layer in the mass ratio of the range of 20% to 60%, in view of improving the adhesiveness of the smooth layer with the gas barrier layer, preventing occurrence of cracks when the substrate is bent or subjected to a heat treatment, and keeping an excellent optical property regarding transparency and a refractive index of the gas barrier film.

In the present invention, used as silica particles may be a substance in which silica particles are chemically bonded by forming a silyloxy group between the silica particles via a hydrolytic decomposition reaction of a hydrolysable silyl group of a hydrolyzable silane modified with a polymerizable unsaturated group.

Examples of a hydrolytic silyl group include: carboxylate silyl groups such as an alkoxy silyl group and an acetoxy silyl group; halogenated silyl groups such as a chloro silyl group; an amino silyl group; an oxime silyl group; and a hydrido silyl group.

Examples of a polymerizable unsaturated group include an acryloyloxy group, a methacryloyloxy group, a vinyl group, a propenyl group, a butadienyl group, a styryl group, an ethynyl group, a cinnamoyl group, a malate group and an acrylamide group.

The thickness of the smooth layer used in the present invention is preferably in the range of 1 µm to 10 µm and more preferably in the range of 2 µm to 7 µm, in view of improving the smoothness of a substrate, making it easy to adjust the balance in the optical property of a substrate, and preventing the curl of a smooth film when a smooth layer is provided only on one surface of a substrate.

Further, a bleed out prevention layer may be provided on the substrate according to the present invention.
(Bleedout Preventing Layer)

A bleedout preventing layer is preferably provided on the surface of a substrate opposite to the surface on which the smooth layer is provided, in order to avoid the contamination of the contact layer due to the migration of such as an unreacted oligomer from the inside of the substrate to the surface, when a film having a smooth layer is heated. As far as the bleedout preventing layer has this function, the bleedout preventing layer may have the same constitution as that of the smooth layer.

As an unsaturated organic compound having a polymerizable unsaturated group, which may be incorporated in a bleedout prevention layer, a polyvalent unsaturated organic compound having two or more polymerizable unsaturated groups in the molecule or a monovalent unsaturated organic compound having one polymerizable unsaturated group in the molecule may be cited.

As other additive agents, a matting agent may be incorporated. As a matting agent, inorganic particles having an average particle diameter of 0.1-5 µm are preferably used.

As such inorganic particles, one kind or two or more kinds in combination of silica, alumina, talc, clay, calcium carbonate, magnesium carbonate, barium sulfate, aluminum hydroxide, titanium dioxide or zirconium dioxide may be used.

The matting agent containing inorganic particles is desirably contained in a ratio of 2 mass parts or more, preferably 4 mass parts or more, and more preferably 6 mass parts or more, but 20 mass parts or less, preferably 18 mass parts or less, and more preferably 16 mass parts or less, in the solid content of the bleedout preventing layer of 100 mass parts.

In the bleedout preventing layer, for example, a thermoplastic resin, a thermo-curable resin, an ionization radiation-curable resin, or a photopolymerization initiator, as a component other than a hard-coat agent and a matting agent, may further be incorporated.

The aforementioned bleedout preventing layer can be prepared by: preparing a coating liquid obtained by mixing a hard coat agent, a matting agent, and other component, if necessary, and by appropriately using a diluting solvent, if necessary; and applying the coating liquid on the surface of a substrate film according to a method known in the art, followed by irradiating the substrate with ionization radiation.

Examples of a method to irradiate the substrate with ionization radiation include: irradiating the substrate with ultraviolet light having a wavelength range of 100-400 nm, preferably 200-400 nm from a very-high-pressure mercury lamp, a high-pressure mercury lamp, a low-pressure mercury lamp, a carbon arc or a metal halide lamp; and irradiating the substrate with an electron beam having a wavelength of 100 nm or less from a scanning type or a curtain type electron beam accelerator.

The thickness of a bleedout preventing layer is 1-10 µm and preferably 2-7 µm, in view of in view of improving the heat resistance of a substrate, making it easy to adjust the balance in the optical property of a substrate, and preventing the curl of a smooth film when a bleedout preventing layer is provided only on one surface of a substrate.

<<Use Application of Gas Barrier Film>>

The use application of the gas barrier film of the present invention will be explained.

The gas barrier film of the present invention may be used as varieties of matetials or films for sealing.

The gas barrier film of the present invention can be used specifically usefully for an organic photoelectric conversion element. Since the gas barrier film of the present invention is transparent, when used for an organic photoelectric conversion element, this gas barrier film can be used as a substrate and the element can be constructed so that sun light is introduced from this side. Namely, a transparent conductive layer such as an ITO layer can be provided as a transparent electrode to construct a resin substrate for an organic photoelectric conversion element.

An organic photoelectric conversion element can be sealed off by: forming a semiconductor layer on an ITO transparent conductive layer use as an electrode provided on a substrate; providing an electrode constituted of a metal layer to form an organic photoelectric conversion element; and laminating another sealing material (which may be the same as the above gas barrier film), followed by adhering the aforementioned gas barrier film substrate and the peripheral to seal off the element, whereby an adverse affect of the outside moisture or oxygen gas to the element can be prevented.

The resin substrate for an organic photoelectric conversion element is obtained by forming a transparent conductive film on the layer which has silicon and oxygen of thus obtained gas barrier film.

Formation of a transparent conductive film can be conducted by using, for example, a vacuum evaporation method or a sputtering method. It can also be formed via a coating method, for example, by employing a sol-gel method using, for example, alkoxides of indium and tin. The thickness of a transparent conductive film is preferably 0.1 nm-1000 nm.

Subsequently, an organic photoelectric conversion element which is one of the preferable desirable uses of the gas barrier film of the present invention will be explained.

<<Organic Photoelectric Conversion Element>>

The organic photoelectric conversion element of the present invention will be explained.

Regarding the gas barrier film of the present invention, on the outermost surface of the gas barrier layer, a transparent conductive layer is further formed as an anode, a layer constructing an organic photoelectric conversion element is formed on the anode, a layer to be a cathode is laminated, and another gas barrier film is laminated thereon as a sealing film, followed by adhering.

As another sealing material (a sealing film), a gas barrier film having a layer containing the inorganic compound having the aforementioned dense structure can be employed. Also, a gas barrier film known in the art, for example, used as a wrapping material, such as a plastic film vacuum evaporated thereon silicon oxide or aluminum oxide, and a gas barrier film having a constitution in which dense ceramic layer and shock relaxing polymer layers having flexibility are alternatively laminated, may be used as the sealing film.

Specifically, a metal foil on which resin laminate (a polymer layer) is formed is preferably used as a scaling film for a purpose in which ejection of light is not expected (transparency is not required), although it cannot be used as a gas barrier film on the light ejecting side.

In the present invention, a metal foil means a foil or a film of a metal produced, for example, by rolling, and it is distinguished from a thin film of a metal formed via sputtering or vacuum evaporation, or from an electrically conductive film formed from a fluid electrode material such as an electrically conductive paste.

The metal element of a metal foil is not specifically limited, and cited may be a copper (Cu) foil, an aluminum (Al) foil, a gold (Au) foil, a brass foil, a nickel (Ni) foil, a titanium (Ti) foil, a copper alloy foil, a stainless steel foil, a tin (Sn) Foil and a high nickel-content-alloy foil. Among these various metal foils, an aluminum foil may be cited as a specifically preferable metal foil.

The thickness of a metal foil is preferably 6-50 µm, in view of preventing occurrence of pin holes, improving a gas barrier property (namely, a moisture permeability or an oxygen permeability), and improving the productivity In a metal foil laminated with a resin film (a polymer film) laminated thereon, the various materials described in "KINOUSEI HOUSOUZAIRYO NO SHINTENKAI" (published by Toray Research Center, Inc.) may be used for the resin film, examples of which include: a polyethylene resin, a polypropylene resin, a polyethylene terephthalate resin, a polyamide resin, an ethylene-vinyl alcohol copolymer resin, an ethylene-vinyl acetate copolymer resin, an acrylonitrile-butadiene copolymer resin, a cellophane resin, a vinylon resin and a vinylidene chloride resin.

Resins such as a polypropylene resin and a nylon resin may be stretched, or, further, may be coated with a vinylidene chloride resin. With respect to a polyethylene resin, a low density resin or a high density resin may be used.

Although will be mentioned later, as a method to seal two films, for example, a resin layer which can be thermally fused using a commonly used impulse sealer is laminated, and sealed using an impulse sealer by fusing. In this case, the thickness of a gas barrier film is preferably 300 µm or less, in view of improving the handling property of the film in the sealing process, and easier thermal fusion, for example, when an impulse sealer is used.

(Seal of Organic Photoelectric Conversion Element)

In the organic photoelectric conversion element of the present invention, the organic photoelectric conversion element can be sealed off by: forming each layer of an organic photoelectric conversion element on a resin substrate for an organic photoelectric conversion element obtained by forming a transparent conductive layer on the gas barrier film of the present invention; and covering the cathode surface with the aforementioned sealing film under a purged circumstance with an inert gas.

As an inert gas, a rare gas such as He or Ar is preferably used besides $N_2$. A rare gas obtained by mixing He and Ar is also preferably used. The ratio of a rare gas in the gas phase is preferably 90-99.9% by volume. The storage stability of the organic photoelectric conversion element is improved by sealing under a purged circumstance with an inert gas.

When an organic photoelectric conversion element is sealed using the aforementioned metal foil laminated with a resin film (a polymer layer), it is preferable that a ceramic layer is formed on a metal foil, and the surface of the layer containing the ceramic compound is adhered onto the cathode, but not the surface of the resin film laminated on the metal foil.

When the polymer layer side is adhered onto the cathode, it may occasionally happen that electrical conduction partially occurs.

As the method to adhere a sealing film onto the cathode of an organic photoelectric conversion element, cited may be a method to laminate a film which is commonly used and can be thermally fused using an impulse sealer, for example, an ethylene-vinyl acetate copolymer (EVA) film, a polypropylene (PP) film or a polyethylene (PE) film, followed by sealing using an impulse sealer by fusing.

As an adhesion method, a dry lamination method is excellent in view of workability. In this method, a curable adhesives layer of about 1.0-2.5 µm thick is generally used.

However, since the adhesive may tunnel, bleed out or cause wrinkles by shrinking when the applied amount of the adhesive is too much, the applied amount of the adhesive is preferably adjusted within 3-5 µm as a dried film.

A hot melt lamination method is a method to melt a hot melt adhesive agent and apply onto a substrate to form an adhesive layer. In this method, the thickness of the adhesive layer can be selected in a wide range of 1-50 µm. As a base resin of a generally used hot melt adhesive agent, for example, EVA, EEA, polyethylene, and butyl rubber are usable. Also, for example, rosin, a xylene resin, a terpene resin or a stylene resin is used as an adhesiveness providing agent, and, for example, a wax is used as a plasticizer.

The extrusion lamination method represents a method to apply a resin melted at a high temperature onto a substrate using a die. In this method, it is possible to select the thickness of the resin layer within a wide range of 10-50 μm.

As a resin used for the extrusion lamination method, for example, LDPE, EVA and PP are generally usable.

Subsequently, the layer constitution of the organic photoelectric conversion element of the present invention will be explained.

(Constitution of Organic Photoelectric Conversion Element)

Preferable embodiments of an organic photoelectric conversion element relating the present invention will be explained, however, the present invention is not limited thereto.

The constitution of the organic photoelectric conversion element of the present invention is not specifically limited, and it is preferably an element which has an anode, a cathode and at least one electric power generation layer (a mixed layer of a p-type semiconductor and an n-type semiconductor, also referred to as a bulk hetrojunction layer or an i layer), and generates electricity when irradiated with light.

Preferable examples of the layer constitution of an organic photoelectric conversion element will be shown below.

(i) Anode/power generation layer (also referred to as a photoelectric conversion layer)/cathode
(ii) Anode/hole transport layer/power generation layer (or a photoelectric conversion layer)/cathode
(iii) Anode/hole transport layer/power generation layer (or a photoelectric conversion layer)/electron transport layer/cathode
(iv) Anode/hole transportation layer/p-type semiconductor layer/power generation layer (or a photoelectric conversion layer)/n-type semiconductor layer/electron transport layer/cathode
(v) Anode/hole transport layer/1st power generation layer (also referred to as a photoelectric conversion layer)/electron transport layer/middle electrode/hole transportation layer/2nd power generation layer (also referred to as a photoelectric conversion layer)/electron transport layer/cathode <<Power Generation Layer (Also Referred to as a Photoelectric Conversion Layer)>>

The power generation layer of the organic photoelectric conversion element of the present invention will be explained.

The power generation layer of the organic photoelectric conversion element of the present invention needs to contain a p-type semiconductor material which can convey an electron hole, and an n-type semiconductor material which can convey an electron. These materials may form a heterojunction with substantially two layers or may form a bulk heterojunction with one layer inside of which is of a mixed state, while the bulk heterojunction is preferred in view of a improving the photoelectric conversion efficiency.

The p-type semiconductor material and the n-type semiconductor material will be described later.

As the same as the case of the emission layer of an organic EL element, the efficiency of taking out holes and electrons from the anode·cathode, respectively, can be improved by sandwiching the power generation layer with a hole transport layer and an electron transport layer. Accordingly, the constitutions having those (namely, (ii) and (iii)) are more preferable.

The power generation layer itself may also be of a constitution in which the power generation layer is sandwiched between a layer containing a p-type semiconductor material and a layer containing an n-type semiconductor material as shown in (iv) (also referred to as p-i-n constitution) in order to improve the rectification property of holes and electrons (namely, selectivity of carriers taken out).

Further, in order to improve the utilization efficiency of the sunlight, it may be of a tandem constitution (namely, the constitution shown as (v)) in which sun light of different wavelength can be absorbed by respective power generation layers.

In order to raise the utilization rate of sunlight (or a photoelectric conversion efficiency), it is also possible to adopt a constitution of a back contact type organic photoelectric conversion element in which Positive hole transport layer 14 and Electron transport layer 16 are respectively formed on a pair of comb electrodes and further a Photoelectric conversion part 15 is arranged thereon, instead of the sandwich structure as shown in FIG. 1.

Further, detailed preferable embodiments of the organic photoelectric conversion elements of the present invention will be explained with referring to FIGS. 1-3.

FIG. 1 is a cross-sectional figure illustrating one example of a solar cell composed of a bulk heterojunction type organic photoelectric conversion element. In Organic photoelectric conversion element 10 of a bulk heterojunction type shown in FIG. 1, Anode 12, Hole transport layer 17, Power generation layer 14 of a bulk heterojunction type, Electron transport layer 18 and Cathode 13 are sequentially laminated on one surface of Substrate 11.

Substrate 11 is a member which holds Anode 12, Power generation layer 14, and Cathode 13 which are laminated successively. In this embodiment, light to be photoelectrically converted enters from the side of Substrate 11. Accordingly, Substrate 11 is a member which can transmit light to be photoelectrically converted, namely, a transparent member with respect to the light to be photoelectrically converted.

As Substrate 11, for example, a glass substrate or a resin substrate is used. Substrate 11 is not always necessary and organic bulk heterojunction type Organic photoelectric conversion element 10 may be constituted by forming Anode 12 and Cathode 13 on both sides of Power generation layer 14, for example.

The power generation layer 14 is a layer which converts light energy to electric energy, and is constituted of a bulk heterojunction layer in which a p-type semiconductor material and an n-type semiconductor material are uniformly mixed. A p-type semiconductor material functions as a relatively electron donating material (or a donor), and an n-type semiconductor material functions as a relatively electron accepting material (or an acceptor).

In FIG. 1, the incident light entering to Anode 12 through Substrate 11 is absorbed by an electron donor or an electron acceptor in the bulk heterojunction layer of Photoelectric conversion layer 14. An electron is transferred from the electron donor to the electron acceptor to form a pair of electron and positive hole (charge separation state).

The generated electric charge is transported by an internal electric field, for example, the electric potential difference of Anode 12 and Cathode 13 when the work functions of Anode 12 and Cathode 13 are different. An electron passes through electron acceptors, while a positive hole passes through electron donors, and the electron and the positive hole each are respectively transported to a different electrode, and a photo-current is detected.

For example, when the work function of Anode 12 is larger than the work function of Cathode 13, the electron is transported to Anode 12 and the positive hole is transported to Cathode 13.

In addition, if the size of a work function is reversed, the electron and the positive hole will be transported to the reverse direction to that described above. Moreover, the transportation directions of an electron and a positive hole are also controllable by applying a potential between Anode 12 and Cathode 13.

In addition, although not described in FIG. 1, it may be possible to have other layers, such as a positive hole block layer, an electron block layer, an electron injection layer, a positive hole injection layer, or a smoothing layer.

Figure 2:
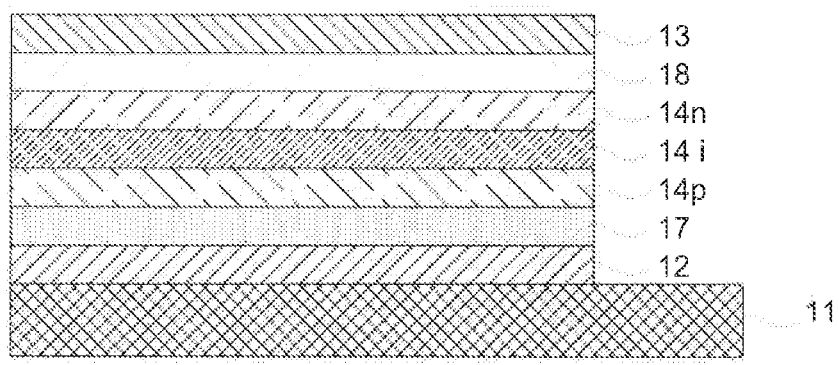
FIG. 2 is a cross-sectional figure illustrating a solar cell composed of an organic photoelectric conversion element equipped with a photoelectric conversion layer having a p-i-n three layer structure.

More preferable structure is a structure in which the above-mentioned Power generation layer 14 is composed of three layered structure of so-called p-i-n structure (FIG. 2). The usual bulk heterojunction layer is a single layer i containing a p-type semiconductor material and an n-type semiconductor material mixed with each other. By sandwiching the i layer with a p layer composed of a p-type semiconductor material single substance and an n layer composed of an n-type semiconductor material single substance, the rectifying property of a positive hole and an electron becomes higher, the loss caused by the recombination of a positive hole and an electron which carried out charge separation is reduced, and still higher photoelectric conversion efficiency can be acquired by this structure.

Furthermore, it is also possible to make a tandem type structure produced by laminating a plurality of the aforesaid photoelectric conversion elements for the purpose of improving a sunlight utilization factor (photoelectric conversion efficiency).

Figure 3:
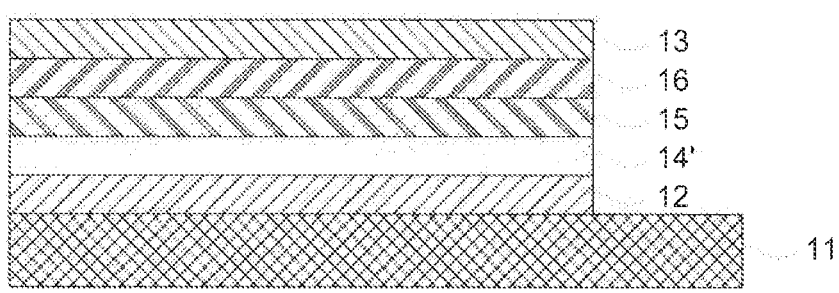
FIG. 3 is a cross-sectional figure illustrating a solar cell composed of an organic photoelectric conversion element equipped with a tandem type bulk heterojunction layer.

FIG. 3 is a cross-sectional view showing a solar cell having an organic photoelectric conversion element containing bulk heterojunction layers of a tandem type. A tandem type structure can be made as follows. After laminating Anode 12 and the First power generation layer 14' successively on Substrate 11, Charge recombination layer 15 is laminated. Then, Second power generation layer 16 and Counter electrode 13 are laminated to achieve a tandem type structure. Second power generation layer 16 may be a layer which absorbs the same spectrum as an absorption spectrum of First power generation layer 14', or it may be a layer which absorbs a different spectrum, however, it is preferably a layer which absorbs a different spectrum. Moreover, both First power generation layer 14' and Second power generation layer 16 may be of the three layered lamination structure of p-i-n as mentioned above.

<<P-Type Semiconductor Material, N-Type Semiconductor Material>>

Materials used for forming the power generation layer (also referred to as a photoelectric conversion layer) of the organic photoelectric conversion element of the present invention will be explained.

(P-Type Semiconductor Material)

As a p-type semiconductor material used for forming the bulk heterojunction layer used as a power generation layer of the organic photoelectric conversion element of the present invention, various types of condensed polycyclic aromatic low molecular weight compounds and conjugated polymers and oligomers are cited.

Examples of a condensed polycyclic aromatic low molecular weight compound include: anthracene, tetracene, pentacene, hexacene, heptacene, chrysene, picene, fulminene, pyrene, peropyrene, perylene, terylene, quoterylene, coronene, ovalene, circumanthracene, bisanthene, zethrene, heptazethrene, pyanthrene, violanthene, isoviolanthene, circobiphenyl, anthradithiophene; porphyrin, copper phthalocyanine; tetrathiafulvalene (TTF)—tetracyanoquinodimethane (TCNQ) complex, bisethylenetetrathiafulvalene (BEDTITF)—perchloric acid complex; and a derivative or a precursor thereof.

As examples of a derivative containing a condensed polycyclic compound include: pentacene compounds having a substituent disclosed in WO 03/16599, WO 03/28125, U.S. Pat. No. 6,690,029, and JP-A No. 2004-107216; pentacene precursors disclosed in US 2003/136964; substituted acenes with a trialkylsilylethynyl group disclosed in J. Amer. Chem. Soc., vol. 127, No. 14, p. 4986, J. Amer. Chem. Soc., vol. 123, p. 4982, and J. Amer. Chem. Soc., vol. 130 (2008), No. 9, p. 2706.

Examples of a conjugated polymer include: polythiophene such as 3-hexylthiohene (P3HT) and its oligomer, polythiophene having a polymerizable group disclosed in Technical Digest of the International PVSEC-17, Fukuoka, Japan, 2007, P. 1225, polythiophene-thienophene copolymer disclosed in Nature Material, Vol. 5, p. 328 (2006), polythiophene-diketopyrrolopyrrole copolymer disclosed in WO 2008/000664, polythiophene-thizolothiazole copolymer disclosed in Adv. Mat., p. 4160 (2007), polythiophene copolymer disclosed in Nature Material, Vol. 6, p. 497 (2007), polypyrrole and its oligomer, poly aniline, polyphenylene and its oligomer, polyphenylene vinylene and its oligomer, poly thienylene vinylene and its oligomer, polyacethylene, polydiacetylene, σ conjugated polymers such as polysilane and polygerman.

Suitably usable oligomers rather than polymers are: thiophene hexamers such as: α-sexithionene, α,ω-dihexyl-α-sexithionene, α, ω-dihexyl-α-quinquethionene, and α,ω-bis (3-butoxypropyl)-α-sexithionene.

Among these, preferred are compounds which has a sufficient high solubility to an organic solvent to be able to carry out a solution process, and which forms a crystalline thin film and can realize a high mobility after drying.

When an electron transporting layer is formed on a power generation layer with a coating method, since there may occur the problem that the solution for the electron transporting layer may dissolve the power generation layer, it can be used a material which will become insoluble after forming a layer with a solution process.

Examples of such materials include: a polythiophene compound having a polymerizable group which becomes insoluble through cross-linked polymerization after being coated as described in Technical Digest of the International PVSEC-17, Fukuoka, Japan, 2007, p. 1225; a compound having a soluble group which becomes insoluble (becomes to a pigment) by addition of thermal energy as described in US 2003/136964 and JP-A No. 2008-16834.

(N-Type Semiconductor Material)

There is no limitation in particular to an n-type semiconductor material used in the bulk heterojunction layer. Examples of such an n-type semiconductor material include: fullerene, octaazaporphyrin, a perfluoro compound of a p-type semiconductor, of which hydrogen atoms are replaced with fluorine atoms (for example, perfluoropentacene and perfluorophthalocyanine), a polymer compound which contains an aromatic carboxylic acid anhydride and its imide in the structure, such as naphthalenetetracarboxylic anhydride, naphthalenetetracarboxylic diimide, perylenetetracarboxylic anhydride, and perylenetetracarboxylic diimide.

However, preferred is a fullerene derivative which enables high speed (around 50 fs) and effective charge separation with varieties of p-type semiconductor materials. Examples of a fullerene derivative include: fullerene $C_{60}$, fullerene $C_{70}$, fullerene $C_{76}$, fullerene $C_{78}$, fullerene $C_{84}$, fullerene $C_{240}$, fullerene $C_{540}$, mixed fullerene, fullerene nano-tube, multi layer nano-tube, mono layer nano-tube, and nano-horn (cone type) and a fullerene derivative a part of which is substituted with a hydrogen atom, a halogen atom, a substituted or unsubstituted alkyl group, an alkenyl group, an alkynyl group, an aryl group, a heteroaryl group, a cycloalkyl group, a silyl group, an ether group, a thioether group, an amino group or a silyl group.

Among these, it is preferable to use a fullerene derivative which has an improved solubility by an introduction of a substituent. Examples thereof are: [6,6]-phenyl C61-butyric acid methyl ester (abbreviated name PCBM), [6,6]-phenyl C61-butyric acid n-butyl ester (PCBnB), [6,6]-phenyl C61-butyric acid isobutyl ester (PCBiB), [6,6]-phenyl C61-butyric acid n-hexyl ester (PCBH), bis-PCBM described in Adv. Mater., Vol. 20 (2008), p. 2116, amino fullerene described in JP-A No. 2006-199674, metallocene fullerene described in JP-A No. 2008-130889, and fullerene containing a cyclic ether group described in U.S. Pat. No. 7,329,709.

(Positive Hole Transport Layer, Electron Blocking Layer)

Organic photoelectric conversion element 10 of the present invention preferably has Positive hole transport layer 17 between the bulk heterojunction layer and the anode, since it becomes possible to more effectively take out charges generated in the bulk heterojunction layer.

As a material to constitute the aforesaid layers, there can be used for Positive hole transport layer 17, for example: PEDOT (product name Baytron™ made by Starck Vitec Co.), polyaniline and its dope material, and a cyan compound described in WO 06/019270.

In addition, to the positive hole transport layer which has a LUMO level shallower than the LUMO level of the n-type semiconductor material used for a bulk heterojunction layer, there is provided an electron blocking function having an rectifying effect by which the electron generated in the bulk heterojunction layer is not passed to the anode side.

The above-described positive hole transport layer is also called an electron blocking layer, and it is more preferable to use a positive hole transport layer having such function. Examples of these materials include: a triaryl amine compound described in JP-A No. 5-271166, a metal oxide such as molybdenum oxide, nickel oxide and tungsten oxide.

Moreover, the layer which consists of a single substance of a p-type semiconductor material used for the bulk heterojunction layer can also be used. As a means to form these layers, although any one of a vacuum deposition method and a solution coating method can be used, preferably used is a solution coating method. When a coated layer is formed as an under layer before forming a bulk heterojunction layer, it will have an effect of leveling the coating surface. This will result in decreasing a leaking effect and it is preferable.

(Electron Transport Layer•Positive Hole Blocking Layer)

Organic photoelectric conversion element 10 of the present invention preferably has Electron transport layer 18 between the bulk heterojunction layer and the cathode, since it becomes possible to more effectively take out charges generated in the bulk heterojunction layer.

As Electron transport layer 18, there can be used: octaazaporphyrin and perfluoro derivative of a p-type semiconductor (for example, perfluoro pentacene and perfluoro phthalocyanine). To the electron transport layer which has a HOMO level deeper than the HOMO level of the p-type semiconductor material used for a bulk heterojunction layer, there is provided, at the same time, a positive hole blocking function having an rectifying effect by which the positive hole generated in the bulk heterojunction layer is not passed to the cathode side.

The above-described electron transport layer is also called as a hole block layer, and it is more preferable to use the electron transport layer which have such function.

Examples of a material for that include: a phenanthrene system compound such as bathocuproine; an n-type semiconductor material such as naphthalenetetracarboxylic acid anhydride, naphthalenetetracarboxylic acid diimide, perylenetetracarboxylic acid anhydride and perylenetetracarboxylic acid diimide; an n-type inorganic oxide such as titanium oxide, zinc oxide and gallium oxide; and an alkali metal compound such as lithium fluoride, sodium fluoride and cesium fluoride.

Moreover, the layer which consists of a single substance of an n-type semiconductor material used for the bulk heterojunction layer can also be used. As a means to form these layers, although any one of a vacuum deposition method and a solution coating method can be used, preferably used is the solution coating method.

(Other Layers)

It is also preferable to have a constitution containing various interlayers in an element for the purpose of improvement in energy conversion efficiency, and improvement in lifetime of the element. Examples of an interlayer include: a positive hole blocking layer, an electron blocking layer, a positive hole injection layer, an electron injection layer, an exciton blocking layer, a UV absorption layer, a light reflection layer and a wavelength conversion layer.

(Transparent Electrode (First Electrode))

A transparent electrode according to the present invention can be selected according to the constitution of the element without specifically limiting as a cathode or an anode, however, it is preferable that a transparent electrode is used as an anode. For example, when the transparent electrode is used as an anode, it is preferably an electrode which transmits light of 380 to 800 nm. Examples of a material used for that include: a transparent conductive metal oxide such as indium tin oxide (ITO), $SnO_2$ and ZnO; a metal thin film such as gold, silver and platinum; a metal nanowire; and a carbon nanotube.

Usable is a conductive polymer selected from the group of derivatives of: polypyrrole, polyaniline, polythiophene, poly thienylene vinylene, polyazulene, polyisothianaphthene, polycarbazole, polyacethylene, polyphenylene, polyphenylene vinylene, polyacene, polyphenyl acetylene, polydiacetylene, and polynaphthalene. A transparent electrode can also be constructed by combining a plurality of these conductive compounds.

(Counter Electrode (Second Electrode))

A counter electrode may be a sole layer of a conductive material, however, in addition to the conductive material, a resin may also be added in combination to hold the conductive material. As a conductive material for the counter electrode, a metal, an alloy, and an electric conductive compound, having a small work function, and a mixture thereof are usable.

Specific examples of the electrode material include: sodium, sodium potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and a rare earth metal.

Among these, from the viewpoints of a taking out property of an electron and resistance to oxidation, preferable is a mixture of these metals and the second metal which has a larger work function and is more stable than these metals, for example, a magnesium/silver mixture, a magnesium/aluminum mixture, a magnesium/indium mixture, an aluminum/aluminum oxide ($Al_2O_3$) mixture, a lithium/aluminum mixture, and aluminum.

The counter electrode can be produces by forming a thin film by using a method such as vacuum evaporation or sputtering of the electrode material. The thickness of the thin film is generally selected from 10 nm to 5 μm, and preferably it is selected from 50 to 200 nm.

When a metallic material is used as a conductive material for a counter electrode, the light arrived at the counter electrode side is reflected and it is reflected to the first electrode side. This light becomes possible to be recycled, and it is again absorbed by a photoelectric conversion layer. This is preferable because this results in more improvement of its photoelectric conversion efficiency.

Counter electrode 13 may be made of: a metal (for example, gold, silver, copper, platinum, rhodium, ruthenium, aluminum, magnesium and indium), nanoparticles made of carbon, nanowires and a nano structure. A dispersion of nanowires is preferable, since it can form a transparent counter electrode having high electrical conductivity via a coating method.

When the counter electrode side is made light transmissive, it can be made as follows. After producing a film of a conductive material suitable for a counter electrode, for example, an aluminum and an aluminum alloy, silver, and a silver compound, having a thickness of about 1 to 20 nm, a transparent counter electrode can be produced by providing a film of a conductive light transmissive material cited for the description of the above-mentioned transparent electrode.

(Intermediate Electrode)

As a material for an intermediate electrode which is needed in a tandem constitution as shown in the above-mentioned (v) (or in FIG. 3), preferable is a layer using the compound having both transparency and electrical conductivity. Materials used for the above-mentioned transparent electrode are usable (a transparent metal oxide such as ITO, AZO, FTO or titanium oxide; a very thin metal layers made of such as Ag, Al and Au; a layer containing nanoparticles and nanowires; a conductive polymer material such as PEDOT: PSS and poly aniline).

In addition, among the aforementioned positive hole transport layer and electron transport layer, there may be a combination which be used as an intermediate electrode (electric charge recombination layer) when they are suitable selected and laminated with each other. When such constitution is employed, it is preferable since one manufacturing process to form one layer can be eliminated.

(Metal Nanowire)

As a conductive fiber according to the present invention, usable are, for example, an organic or inorganic fiber which is coated with a metal, a conductive metal oxide fiber, a metal nanowire, a carbon fiber and a carbon nanotube. Among them, a metal nanowire is preferably used.

Generally, a metal nanowire indicates a linear structure composed of a metallic element as a main structural element. In particular, the metal nanowire in the present invention indicates a linear structure having a diameter of a nanometer (nm) size.

In order to form a long conductive path by one metal nanowire and to provide an appropriate light scattering property, a metal nanowire according to the present invention is preferably have an average length of 3 μm or more, more preferably 3 to 500 μm, and still more preferably 3 to 300 μm. In addition, the relative standard deviation of the length of the conductive fibers is preferably 40% or less.

Moreover, from a viewpoint of transparency, the average diameter is preferably smaller. On the other hand, the average diameter is preferably larger in view of the electrical conductivity. In the present invention, the average diameter of a metal nanowire is preferably from 10 nm to 300 nm, and more preferably from 30 nm to 200 nm. Further, the relative standard deviation of the diameter is preferably 20% or less.

There is no restriction in particular to the metal composition of the metal nanowire according to the present invention, and it can be composed of one sort or two or more sorts of metals of noble metal elements or base metal elements. It is preferable that it contains at least one sort of metal selected from the group of noble metals (for example, gold, platinum, silver, palladium, rhodium, iridium, ruthenium and osmium), iron, cobalt, copper and tin. It is preferable that at least silver is included in it from a conductive viewpoint.

Moreover, for the purpose of achieving compatibility of conductivity and stability (sulfuration resistance and oxidation resistance of metal nanowire and migration resistance of metal nanowire), it is also preferable that it contains silver and at least one sort of metal belonging to the noble metal except silver. When the metal nanowire of the present invention contains two or more kinds of metallic elements, metal composition may be different between the surface and the inside of metal nanowire, or the whole metal nanowire may have the same metal composition.

In the present invention, there is no limitation in particular to the production means of a metal nanowire. It is possible to prepare metal nanowires via various methods such as a liquid phase method or a gas phase method.

For example, the manufacturing method of an Ag nanowire may be referred to Adv. Mater. 2002, 14, 833-837 and Chem. Mater. 2002, 14, 4736-4745; the manufacturing method of an Au nanowire may be referred to JP-A No. 2006-233252; the manufacturing method of a Cu nanowire may be referred to JP-A No. 2002-266007; and the manufacturing method of a Co nanowire may be referred to JP-A No. 2004-149871.

Specifically, the manufacturing methods of Ag nanowires, described in aforementioned Adv. Mater. and Chem. Mater., may be preferably employed as a manufacturing method of a metal nanowire according to the present invention, since via those methods, it is possible to simply prepare a large amount of an Ag nanowire in an aqueous system and the electrical conductivity of silver is highest of all metals.

In the present invention, a three-dimensional conductive network is formed by mutual contact of nanowires and high conductivity is achieved. By this, a light can penetrate the window part of the conductive network where metal nanowires do not exist, and further, it becomes possible to perform efficiently the generation of electricity by the scattering effect of the metal nanowires in the organic photoelectric conversion layer portion. It is a preferable embodiment to arrange a metal nanowire in a portion closer to the organic power generation region in the first electrode because the light scattering effect of the metal nanowire can be effectively utilized.

(Optical Function Layer)

The organic photoelectric conversion element of the present invention may be provided with various types of optical function layers for the purpose of efficient light receiving of sunlight. As an optical function layer, there may be provided an anti-reflection layer, a light condensing layer such as a microlens array, a light diffusion layer which can scatter the light reflected by the cathode and can make the light enter again in the photoelectric conversion layer.

As an anti-reflection layer, well-known anti-reflection layer can be prepared. For example, when a transparent resin film is a biaxial stretching polyethylene terephthalate film, it is preferable to set the refractive index of the adhesion assisting layer, which is adjacent to the film, to be from 1.57 to 1.63. This will improve transmittance by decreasing the interface reflection between the film substrate and the adhesion assisting layer.

As a way of adjusting a refractive index, it can be carried out by adjusting suitably the ratio of a binder resin to oxide sol having a comparatively high refractive index such as a tin oxide sol and a cerium oxide sol and by coating it. Although a single layer of adhesion assisting layer may be sufficient, in order to raise adhesion property, a composition of two or more adhesion assisting layers may also be used.

Regarding the light condensing layer, it is possible to increase an amount of the receiving light from a special direction or, conversely, to reduce the incident angle dependency of sunlight by providing a structure of a micro lens array on the sunlight receiving side of the substrate or by using in combination with a so-called light condensing sheet.

As an example of a microlens array, it can be cited an arrangement in which the quadrangular pyramidal forms having a base of 30 μm and a vertex angle of 90 degrees are two-dimensionally arranged on the light taking out side of a substrate. The base is preferably in the range of 10 μm to 100 μm. When it is smaller than this range, the effect of diffraction will occur to result in coloring, while when it is larger than this range, the thickness becomes large, whereby it is not desirable.

Moreover, as a light scattering layer, a various types of anti-glare layers and a layer in which are distributed nanoparticles or nanowire made of metal or various inorganic oxides in a colorless transparent polymer can be cited.

(Film Formation Method and Surface Treatment Method)

As a formation method of a bulk heterojunction layer in which an electron acceptor and an electron donor are mixed, a transport layers and electrodes, a vacuum evaporation method and a coating method (including a cast method and a spin coat method) may be cited. Of these, as a formation method of a bulk heterojunction layer, a vacuum evaporation method and a coating method (including a cast method and a spin coat method) may be cited.

Among these, a coating method is preferable in order to increase the area of the interface which carries out charge separation of the above-mentioned positive hole and electron and to produce an element having high photoelectric conversion efficiency. Moreover, the coating method is excellent also in production velocity.

Although there is no limitation in the coating method to be used, examples of the methods are cited as: a spin coat method, a cast method from a solution, a dip coat method, a blade coat method, a wire bar coat method, a gravure coat method and a spray coat method. In addition, also applicable is the patterning method using printing methods such as: an ink-jet method, a screen printing method, a typographic printing method, an intaglio printing method, an offset printing method and a flexography method.

After coating, it is preferable to heat the film in order to remove the residual solvent, water and a gas, as well as to improve the mobility and to shift the absorption in the longer wavelength due to crystallization of a semiconductor material. When an annealing treatment is carried out at a prescribed temperature during a manufacturing process, aggregation or crystallization is microscopically promoted and a suitable phase separation structure can be made in a bulk heterojunction layer. As a result, the carrier mobility of a bulk heterojunction layer can be improved and high efficiency can be obtained.

Power generation layer (Bulk heterojunction layer) 14 may be a single layer containing a uniform mixture of an electron acceptor and an electron donor. It may be a multiplicity of layers each having a different mixing ratio of an electron acceptor and an electron donor. In this case, it becomes possible to form the layer using an aforementioned material which becomes insoluble after coating.

(Patterning)

There is no limitation in particular in the method and the process of patterning, for example, an electrode, a power generation layer, a positive hole transport layer and an electron transport layer according to the present invention, and a well-known approach can be applied suitably.

In the case of a soluble material used for a bulk heterojunction layer and a transport layer, only a unnecessary part may be wiped off after the complete application with a die coat, or a dip coat, or it may be directly patterned at the time of an application using the methods such as an ink-jet method or a screen printing method.

In the case of an insoluble material used for such as an electrode material, mask deposition can be performed at the time of vacuum deposition, or it can be patterned by the well-known methods such as etching or lift-off. Moreover, it may also be possible to form a pattern by transferring the pattern formed on another substrate.

Then, in order to confirm the inclination property of the wire and the existence of a copper-zinc-nickel three component alloy plating, the following measurement was carried out.

Measurement using XPS (X-ray photoelectron microscopy) the element distribution (a concentration inclination) along the depth direction of a wire of copper-zinc-nickel three component plating was investigated before and after the final stretching via a wet method using the instrument (the instrument is one in which routine of: the concentration of element at the measurement surface of a sample is measured; the measurement surface is scraped with an Ar gas; and the concentration of the element at the newly appeared surface on the measuring surface appeared by scraping is measured, is repeated, whereby the concentration inclination of the element along the depth direction of the sample is analyzed).

EXAMPLES

The present invention will be specifically explained with referring to examples below, however, the present invention is not limited thereto.

Example 1

At first, Substrate 1 and Substrate 1a each were prepared.
<<Preparation of Substrate 1>>:

On one surface of a polyester film, a bleed out preventing layer was formed and, on the other surface, a smooth layer was formed.

As the substrate of a thermoplastic layer, a polyester film having a thickness of 125 μm (TETRON O3, produced by Teijin DuPont Films Japan Limited), both surfaces of which were subjected to an adhesion-enhancing treatment was annealed at 170° C. for 30 minutes to be used.

After a bleed out preventing layer was formed on one surface of the polyester film and a smooth layer was formed on the other surface, an adhesive protective layer was pasted, while the aforementioned polyester film was conveyed at a speed of 30 m/minute, whereby a substrate of a roll-like shape was obtained.

(Preparation of Bleed Out Preventing Layer)

On one surface of the a polyester film, a UV curable organic/inorganic hybrid hard coat material OPSTAR Z7535 produced by JSR Corp. was applied using a wire bar so that the thickness after dried was 4 μm, followed by conducting a hardening treatment under a hardening condition: 1.0 J/cm$^2$, in air, and using a high-pressure mercury lamp, and a drying condition: 800° C. for 3 minutes. Thus, a bleed out preventing layer was formed.

(Preparation of Smooth Layer)

Subsequently, on the other surface of the above polyester film, a UV curable organic/inorganic hybrid hard coat material OPSTAR Z7501 produced by JSR Corp. was applied using a wire bar so that the thickness after dried was 4 μm, followed by drying under a condition: 80° C. for 3 minutes. Then, a hardening treatment was conducted in air using a high-pressure mercury lamp under a hardening condition: 1.0 J/cm². Thus, a smooth layer was formed.

<<Preparation of Substrate 1a>>

Substrate 1a was prepared in the same manner as the preparation of Substrate 1 except that, instead of the polyester film, a composite film (having a thickness of 145 μm) obtained by pasting an aluminum foil (also referred to as an aluminum-foil, one having a thickness of 20 μm was used) and a polyester film with each other.

Subsequently, as described below, Gas barrier films 1, 3-13 and 17 of the present invention and comparative Gas barrier films 14-16 each were prepared employing obtained Substrate 1, and Gas barrier film 2 of the present invention was prepared employing Substrate 1a (where Substrate 1a was a composite film obtained by pasting an aluminum foil and a polyester film with each other).

Figure 4:
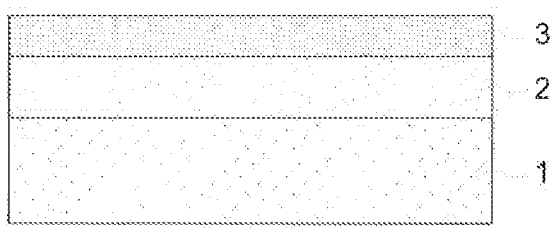
FIG. 4 is a schematic cross-sectional figure of Gas barrier film 1 of the present invention.
Figure 5:
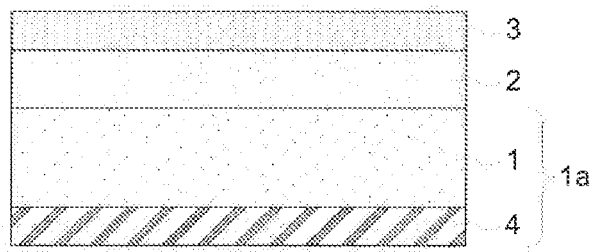
FIG. 5 is a schematic cross-sectional figure of Gas barrier film 2 of the present invention.
Figure 6:
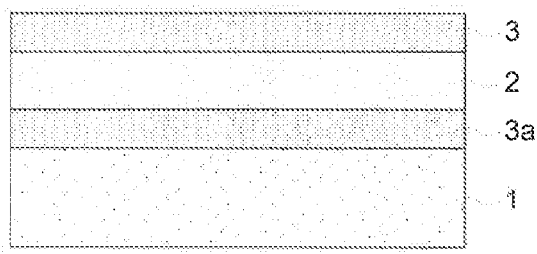
FIG. 6 is a schematic cross-sectional figure of Gas barrier film 3 of the present invention.
Figure 7:
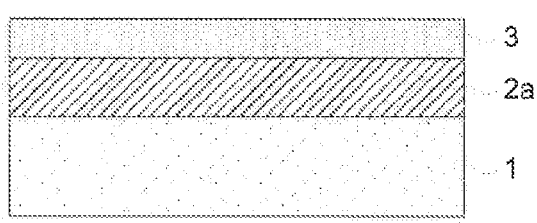
FIG. 7 is a schematic cross-sectional figure of Gas barrier film 4 of the present invention.
Figure 8:
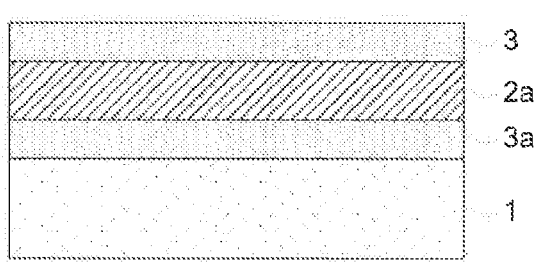
FIG. 8 is a schematic cross-sectional figure of Gas barrier films 5, 6, 7, 8 of the present invention.
Figure 9:
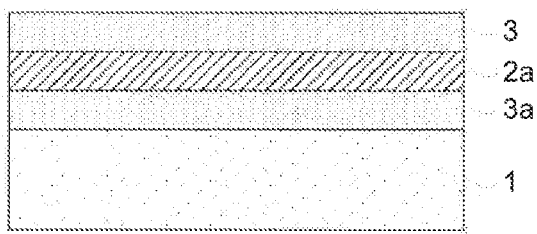
FIG. 9 is a schematic cross-sectional figure of Gas barrier film 9 of the present invention.
Figure 10:
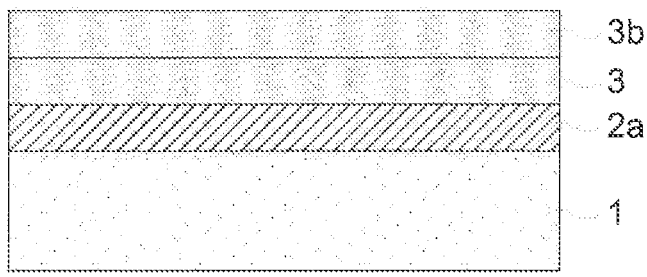
FIG. 10 is a schematic cross-sectional figure of Gas barrier films 10 and 17 of the present invention.
Figure 11:
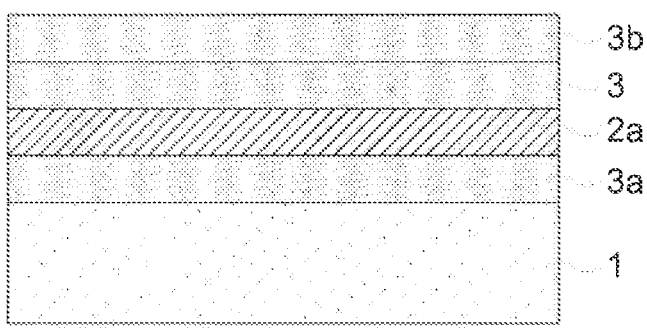
FIG. 11 is a schematic cross-sectional figure of Gas barrier films 11, 12 and 13 of the present invention.
Figure 12:
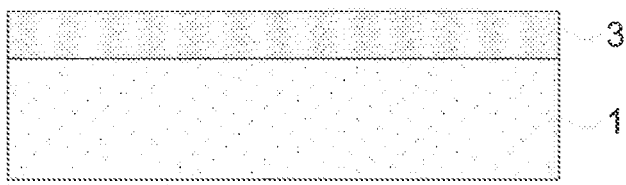
FIG. 12 is a schematic cross-sectional figure of comparative Gas barrier films 14 and 15.
Figure 13:
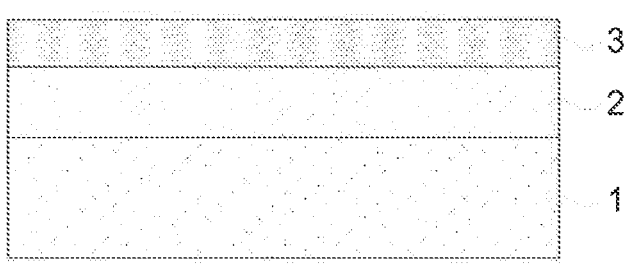
FIG. 13 is a schematic cross-sectional figure of comparative Gas barrier films 16.

The schematic cross-sectional view of each gas barrier film was shown in FIG. 4 for the constitution of Gas barrier film 1 of the present invention, FIG. 5 for the constitution of Gas barrier film 2 of the present invention, FIG. 6 for the constitution of Gas barrier film 3 of the present invention, FIG. 7 for the constitution of Gas barrier film 4 of the present invention, FIG. 8 for the constitution of Gas barrier films 5-8 of the present invention, FIG. 9 for the constitution of Gas barrier film 9 of the present invention, FIG. 10 for the constitution of Gas barrier films 10 and 17 of the present invention, FIG. 11 for the constitution of Gas barrier films 11, 12 and 13 of the present invention, FIG. 12 for the constitution of comparative Gas barrier films 14 and 15, and FIG. 13 for the constitution of comparative Gas barrier film 16.

With respect to each schematic cross-sectional view of the constitution of the gas barrier film shown in FIGS. 4-13, Substrate 1 has a bleed out preventing layer on one surface of the polyester film and a smooth layer on the other surface. However, these layers are not illustrated in FIGS. 4-13.

Manufacturing of Gas Barrier Film 1

The manufacturing of Gas barrier film 1 of the present invention will be explained based on the cross-sectional view of the constitution of Gas barrier film 1 shown in FIG. 4.

Process 1: Preparation of a PHPS Coated Film

On the smooth layer of the Substrate 1, the following PHPS (perhydro polysilazane) solution was applied via a spin coat method (at 2000 rpm, for 60 seconds), and was dried for 10 minutes at 80° C., and thus a PHPS coated film (also referred to as merely a PHPS coatt film) was obtained.

The obtained PHPS coat film (also referred to as a coated film) was not the Silanol-containing layer 2 in this stage, and Silanol-containing layer 2 was formed via a treatment in which the above mentioned PHPS coat film was subjected to a treatment described as Process 3 (treated under an environment of 60° C. and RH 90% for 3 hours).

(Preparation of PHPS Coating Liquid)

A 20 mass % dibutylether solution of perhydro polysilazane (PHPS) (Aquamica NN120-20, non-catalyst type, produced by AZ Electronic Materials) was diluted using dibutylether so as to obtain a 10 mass % liquid.

Process 2: Preparation of Gas Barrier Layer 3

A PHPS liquid prepared by diluting aforementioned NN120-20 (non-catalyst type) using dibutyl ether so as to obtain a 4 mass % liquid was applied on the obtained PHPS coated film via a spin coat method (at 5000 rpm, for 60 seconds) to carry out stack coating on the PHPS coated film, followed by drying at 80° C. for 10 minutes, and conducting a UV ozone oxidation treatment for 30 minutes at 150° C. (a low pressure mercury lamp was used as a light source).

Thus, Gas barrier layer 3 (having a thickness of 60 nm) containing a silicon oxide layer which was converted from the polysilazane (also mentioned as being oxidized) was prepared.

Process 3: Preparation of Silanol-Containing Layer 2

Silanol-containing layer 2 (having a thickness of 200 nm) was prepared from the PHPS (perhydro polysilazane) coated film prepared in Process 1 by heat treating (storing for 3 hours under an environment of 60° C. and 90 RH %) Substrate 1 on which Gas barrier layer 3 was formed.

Here, each thickness of Gas barrier layer 3 and Silanol-containing layer 2 was determined from the cross-sectional photograph obtained by using a TEM (a transmission electron microscope) after film production after the film formation.

The relative SiOH ionic strength detected by the Tof-SIMS measurement of Silanol-containing layer 2 after Gas barrier film 1 was prepared was 1.0 (provided that the relative Si ionic strength was set to 1).

Manufacturing of Gas Barrier Film 2

The manufacturing of Gas barrier film 2 of the present invention will be explained based on the cross-sectional view of the constitution of Gas barrier film 2 shown in FIG. 5.

Gas barrier film 2 was manufactured in the same manner as the manufacturing of Gas barrier film 1 except that, instead of Substrate 1, Substrate 1a (which was a composite film obtained by pasting an aluminum foil and a polyester film with each other) was used.

Manufacturing of Gas Barrier Film 3

The manufacturing of Gas barrier film 3 of the present invention will be explained based on the cross-sectional view of the constitution of Gas barrier film 3 shown in FIG. 6.

Gas barrier film 3 was manufactured in the same manner as the manufacturing of Gas barrier film 1 except that Gas barrier layer 3a (having a thickness of 60 nm) was prepared on Substrate 1 as a second gas barrier layer before the preparation of the PHPS coated film, and, after Gas barrier layer 3 (having a thickness of 60 nm) was formed on the PHPS coated layer, Substrate 1a was heat treated (storing for 3 hours under an environment of 60° C. and 90 RH %) to obtain Silanol-containing layer 2 (having a thickness of 200 nm).

The relative SiOH ionic strength detected by the Tof-SIMS measurement of Silanol-containing layer 2 of obtained Gas barrier film 3 was 0.8 (provided that the relative Si ionic strength was set to 1).

(Formation of Gas Barrier Layer 3a)

After mixing a 20 mass % solution of perhydro polysilazane (PHPS) in dibutyl ether (Aquamica NAX120-20, amine-catalyst type, produced by AZ Electronic Materials) with aforementioned NN120-20 (non-catalyst type) in a ratio of 1:4, the resulting solution was diluted so as to obtain a 4 mass % solution using dibutyl ether.

This diluted PHPS liquid was applied on the substrate via a spin coat method (at 5000 rpm, for 60 seconds), and, after drying at 80° C. for 10 minutes, the following plasma discharge treatment was conducted. Thus, Gas barrier layer 3a (having a thickness of 60 nm) containing a silicon oxide film which was converted from the polysilazane (also mentioned as being oxidized) was prepared.

(Plasma Discharge Treatment)

The condition of the plasma discharge treatment used for preparing the second Gas barrier layer 3a will be shown below.

The substrate temperature was kept at 120° C. during the film formation.

The treatment was carried out using a roll-electrode type discharge treatment apparatus. A plurality of rod-shaped electrodes each facing a roll electrode were installed along the lateral direction of the roll-film support, and a plasma treatment was carried out on the coated surface by supplying a raw material and electric power to each electrode portion, as will be described below.

Both of the opposed electrodes were coated with a dielectric material of a thickness of 1 mm by ceramic thermal spraying. The distance between the electrodes after coated with the dielectric material was set to 1 mm.

The metal base material which was coated with the dielectric material was of a jacket type made of stainless steel having a cooling function with cooling water. The discharge was carried out while controlling the electrode temperature with the cooling water.

A high frequency power source from OYO ELECTRIC Co., Ltd. (80 kHz) and a high frequency power source from Pearl Kogyo Co., Ltd. (13.56 MHz) were used as the power sources.

Discharge gas: $N_2$ gas
Reactive gas: oxygen gas
Power of low frequency side power source: 3 W/cm$^2$ of 80 kHz wave
Power of high frequency side power source: 11 W/cm$^2$ of 13.56 MHz wave The conveyance speed was controlled to obtain the above condition. After the coated layers were dried, each sample was stored under an environment of 23° C. and 20% RH for 1-5 hours before conduction the plasma treatment.

Manufacturing of Gas Barrier Film 4

The manufacturing of Gas barrier film 4 of the present invention will be explained based on the cross-sectional view of the constitution of Gas barrier film 4 shown in FIG. 7.

Gas barrier film 4 was manufactured in the same manner as the manufacturing of Gas barrier film 1 except that, instead of heat treating (keeping for 3 hours under an environment of 60° C. and 90 RH %) to form Silanol-containing layer 2, the same plasma discharge treatment as preparing Gas barrier layer 3a which was formed as the second gas barrier layer of Gas barrier film 3 was conducted to form Silanol-containing layer 2a.

The plasma discharge treatment was conducted after the PHPS coated layer was formed and before Gas barrier layer 3 was prepared.

The relative SiOH ionic strength detected by the Tof-SIMS measurement of Silanol-containing layer 2a was 0.55 (provided that the relative Si ionic strength was set to 1).

Further, it was found by Tof-SIMS that the content of a silanol group existing in Silanol-containing layer 2a showed a concentration gradient along the film depth direction in which the content of the silanol group became larger from the Gas barrier layer 3 side to the Substrate 1 side.

Manufacturing of Gas Barrier Film 5

The manufacturing of Gas barrier film 5 of the present invention will be explained based on the cross-sectional view of the constitution of Gas barrier film 5 shown in FIG. 8.

Gas barrier film 5 was manufactured in the same manner as the manufacturing of Gas barrier film 4 except that Gas barrier layer 3a was prepared on Substrate 1 as a second gas barrier layer similar to the manufacturing of Gas barrier film 3.

The relative SiOH ionic strength detected by the Tof-SIMS measurement of Silanol-containing layer 2a was 0.55 (provided that the relative Si ionic strength was set to 1).

Further, it was found by Tof-SIMS that the content of a silanol group existing in Silanol-containing layer 2a showed a concentration gradient along the film depth direction in which the content of the silanol group became larger from the Gas barrier layer 3 side to the Substrate 1 side.

Manufacturing of Gas Barrier Film 6

The manufacturing of Gas barrier film 6 of the present invention will be explained based on the cross-sectional view of the constitution of Gas barrier film 6 shown in FIG. 8.

Gas barrier film 6 was manufactured in the same manner as the manufacturing of Gas barrier film 5 except that, as a PHPS liquid to form a silanol-containing layer, a solution obtained by mixing NAX120-20 with NN120-20 (non-catalyst type) in a ratio of 1:4 was used instead of NN120-20 (non-catalyst type).

The relative SiOH ionic strength detected by the Tof-SIMS measurement of Silanol-containing layer 2a was 0.4 (provided that the relative Si ionic strength was set to 1).

Further, it was found by Tof-SIMS that the content of a silanol group existing in Silanol-containing layer 2a showed a concentration gradient along the film depth direction in which the content of the silanol group became larger from the Gas barrier layer 3 side to the Substrate 1 side.

Manufacturing of Gas Barrier Film 7

The manufacturing of Gas barrier film 7 of the present invention will be explained based on the cross-sectional view of the constitution of Gas barrier film 7 shown in FIG. 8.

Gas barrier film 7 was manufactured in the same manner as the manufacturing of Gas barrier film 6 except that a hydrogen gas was used as a reactive gas for the plasma discharge treatment conducted to form Silanol-containing layer 2a, instead of an oxygen gas.

The relative SiOH ionic strength detected by the Tof-SIMS measurement of Silanol-containing layer 2a was 0.7 (provided that the relative Si ionic strength was set to 1).

Further, it was found by Tof-SIMS that the content of a silanol group existing in Silanol-containing layer 2a showed a concentration gradient along the film depth direction in which the content of the silanol group became larger from the Gas barrier layer 3 side to the Substrate 1 side.

Manufacturing of Gas Barrier Film 8

The manufacturing of Gas barrier film 8 of the present invention will be explained based on the cross-sectional view of the constitution of Gas barrier film 8 shown in FIG. 8.

Gas barrier film 8 was manufactured in the same manner as the manufacturing of Gas barrier film 6 except that NAX120-20 was used as a PHPS liquid to form Silanol-containing layer 2a, instead of a solution obtained by mixing NAX120-20 (amine-catalyst type) with NN120-20 (non-catalyst type) in a ratio of 1:4.

The relative SiOH ionic strength detected by the Tof-SIMS measurement of Silanol-containing layer 2a was 0.02 (provided that the relative Si ionic strength was set to 1).

Further, it was found by Tof-SIMS that the content of a silanol group existing in Silanol-containing layer 2a showed a concentration gradient along the film depth direction in which the content of the silanol group became larger from the Gas barrier layer 3 side to the Substrate 1 side.

Manufacturing of Gas Barrier Film 9

The manufacturing of Gas barrier film 9 of the present invention will be explained based on the cross-sectional view of the constitution of Gas barrier film 9 shown in FIG. 9.
(Preparation of Gas Barrier Layer 3a)

Gas barrier layer 3a was prepared on Substrate 1 in the same manner as the preparation of Gas barrier layer 3a prepared as the second gas barrier layer in the manufacturing process of Gas barrier film 3.
(Bilayer Simultaneous Preparation of Silanol-Containing Layer 2a and Gas Barrier Layer 3)

After forming one PHPS coated layer on the obtained Gas barrier layer 3a (namely, applying a liquid prepared by diluting aforementioned NN120-20 (non-catalyst type) using dibutyl ether so as to obtain a 10 mass % liquid via a spin coat method (at 2000 rpm, for 60 seconds), followed by drying at 80° C. for 10 minutes), a UV ozone oxidation treatment (a low pressure mercury lamp was used as a light source) was conducted on the obtained PHPS coated layer at 1500° C. for 30 minutes, whereby Silanol-containing layer 2a was prepared, and, simultaneously, the surface portion of the Silanol-containing layer 2a was converted from the PHPS film (namely, a polysilazane layer) to a silicon oxide layer to form Gas barrier layer 3 (having a thickness of 60 nm). The thickness of the obtained Silanol-containing layer 2a was 140 nm.

The relative SiOH ionic strength detected by the Tof-SIMS measurement of Silanol-containing layer 2a was 0.35 (provided that the relative Si ionic strength was set to 1).

Further, it was found by Tof-SIMS that the content of a silanol group existing in Silanol-containing layer 2a showed a concentration gradient along the film depth direction (namely, a concentration gradient in which the content of the silanol group became larger from the surface of Silanol-containing layer 2a to the Gas barrier 3 side).

Here, it was confirmed by using a sputtering method and an XPS surface analysis in combination that Gas barrier layer 3 was provided at the surface layer (also referred to as a surface portion) of Silanol-containing layer 2a by converting the surface portion of Silanol-containing layer 2a to a film containing a silicon oxide ($SiO_2$).

It was found that, when the atomic ratio was measured using an XPS surface analysis while etching was conducted at a rate of 0.5 nm/minute in the depth direction form the surface, provided that the outermost surface was set to 0 nm, the ratio of Si:O was almost 1:2 (namely, a silicon dioxide film: $SiO_2$ film) in the region from the surface to around 60 nm.

The XPS surface analyzer used for the surface analysis is not specifically limited, and any type of instrument may be used. In the present invention, ESCALAB-200R manufactured by VG Scientific, Ltd. was used. Measurement was carried out employing Mg as an X-ray anode, and at output power of 600 W (in which accelerating voltage was 15 kV and emission current was 40 mA).

Manufacturing of Gas Barrier Film 10

The manufacturing of Gas barrier film 10 of the present invention will be explained based on the cross-sectional view of the constitution of Gas barrier film 10 shown in FIG. 10.

Gas barrier film 10 was manufactured in the same manner as the manufacturing of Gas barrier film 9 except that, after two layers of Silanol-containing layer 2a and Gas barrier layer 3 were simultaneously prepared, Gas barrier layer 3b was prepared on Gas barrier layer 3, without preparing Gas barrier layer 3a which was a second gas barrier layer on Substrate 1. Gas barrier layer 3b was prepared in the same manner as the preparation of Gas barrier layer 3 in Gas barrier film 1.

The relative SiOH ionic strength detected by the Tof-SIMS measurement of Silanol-containing layer 2a was 0.45 (provided that the relative Si ionic strength was set to 1).

Manufacturing of Gas Barrier Film 11

The manufacturing of Gas barrier film 11 of the present invention will be explained based on the cross-sectional view of the constitution of Gas barrier film 11 shown in FIG. 11.

Gas barrier film 11 was manufactured in the same manner as the manufacturing of Gas barrier film 10 except that Gas barrier layer 3a described in Gas barrier film 9 was provided on Substrate 1.

The relative SiOH ionic strength detected by the Tof-SIMS measurement of Silanol-containing layer 2a was 0.35 (provided that the relative Si ionic strength was set to 1).

Manufacturing of Gas Barrier Film 12

The manufacturing of Gas barrier film 12 of the present invention will be explained based on the cross-sectional view of the constitution of Gas barrier film 12 shown in FIG. 11.

Gas barrier film 12 was manufactured in the same manner as the manufacturing of Gas barrier film 11 except that the oxidation treatment of Silanol-containing layer 2 was conducted by using a Xe excimer lamp (having a wavelength of 172 nm) instead of the UV ozone oxidation treatment (in which the whole body of Substrate 1 and Gas barrier 3a was irradiated with Xe excimer for 10 seconds).

Manufacturing of Gas Barrier Film 13

The manufacturing of Gas barrier film 13 of the present invention will be explained based on the cross-sectional view of the constitution of Gas barrier film 13 shown in FIG. 11.

Gas barrier film 13 was manufactured in the same mariner as the manufacturing of Gas barrier film 11 except that Gas barrier layer 3b was prepared by using a plasma discharge treatment (in which reactive gas was oxygen) used in the manufacturing of Gas barrier film 3, instead of the UV ozone oxidation treatment.

Manufacturing of Gas Barrier Film 14

Comparative Example

The manufacturing of comparative Gas barrier film 14 will be explained based on the cross-sectional view of the constitution of Gas barrier film 14 shown in FIG. 12.

Gas barrier film 13 was manufactured by applying a liquid prepared by diluting NN120-20 (catalyst type) using dibutyl ether so as to obtain a 10 mass % liquid via a spin coat method (at 2000 rpm, for 60 seconds) on Substrate 1, and drying at 80° C. for 10 minutes, followed by conducting a UV ozone oxidation treatment at 150° C. for 30 minutes.

It was confirmed by using the aforementioned XPS surface analysis that all the polysilazane was converted to a silicon oxide film.

Manufacturing of Gas Barrier Film 15

Comparative Example

The manufacturing of comparative Gas barrier film 15 will be explained based on the cross-sectional view of the constitution of Gas barrier film 15 shown in FIG. 12.

Gas barrier film 15 having Gas barrier layer 3 on Substrate 1 was manufactured in the same manner as the preparation of Gas barrier film 14 except that the treatment of Gas barrier layer 3 was carried our by heating at 1500° C. for 30 minutes in air on a hot plate, instead of the UV ozone oxidation treatment.

It was confirmed by using the aforementioned XPS surface analysis that all the polysilazane was converted to a silicon oxide film.

Manufacturing of Gas Barrier Film 16

Comparative Example

The manufacturing of comparative Gas barrier film 16 will be explained based on the cross-sectional view of the constitution of Gas barrier film 16 shown in FIG. 13.

Comparative Gas barrier film 16 was manufactured in the same manner as the preparation of Gas barrier film 1 except that the condition for preparing Silanol-containing layer 2 from the PHPS coating liquid described in Process 3 (storing for 3 hours under an environment of 60° C. and 90 RH %) was changed to storing for 15 hours.

The relative SiOH ionic strength detected by the Tof-SIMS measurement of Silanol-containing layer 2 was 1.4 (provided that the relative Si ionic strength was set to 1).

Manufacturing of Gas Barrier Film 17

The manufacturing of Gas barrier film 17 of the present Invention will be explained based on the cross-sectional view of the constitution of Gas barrier film 17 shown in FIG. 10.

Gas barrier film 17 was manufactured in the same manner as the manufacturing of Gas barrier film 10 except that, a solution obtained by mixing NAX120-20 (amine catalyst type) with NN120-20 (non-catalyst type) in a ratio of 1:4 was used as a PHPS liquid to form Silanol-containing layer 2a, Gas barrier layer 3 and Gas barrier layer 3b, and the formation of Gas barrier layer 3 on Silanol-containing layer 2a and Gas barrier layer 3b on Gas barrier layer 3 was conducted by using a Xe excimer lamp (having a wavelength of 172 nm) instead of a UV ozone treatment.

The excimer lamp irradiation condition in this preparation was as follows. Using a stage movable type xenon excimer irradiation equipment (production of MD excimer Inc., MECL-M-1-200), irradiation was carried out at, the excimer light intensity: 130 mW/cm$^2$ (172 nm), the distance between the lamp of excimer light source and the substrate: 3 mm, the stage temperature: 100° C., the treatment environment: under dry nitrogen atmosphere, the oxygen concentration in the treatment atmosphere: 0.1%, the moving speed of the stage: 10 mm/second, and conveyance: 10 times.

On each of the Gas barrier films 1-13 and 17 of the present invention and comparative Gas barrier films 14-16, tests for water vapor permeation rate and bending property were carried out as described below.

<<Measurement of Water Vapor Permeation Rate and Evaluation>>

The water vapor permeation rate which is an index of the gas barrier property was measured as described below.

(Equipment)

Vacuum evaporation apparatus: Vacuum evaporation apparatus JEE-400 produced by JEOL Co., Ltd.

Constant temperature-constant humidity oven: Humidic Chamber IG47M produced by Yamato Scientific, Co., Ltd.

Laser microscope: VK-8500 produced by KEYENCE Corp.

Atomic force microscope (AFM): DI3100 produced by Digital Instruments.

(Raw Material)

Metal corrosive by reacting with water: Calcium (granular)

Metal exhibiting no moisture permeation: Aluminum (φ3-5 mm, granular)

(Preparation of Cell for Evaluation of Water Vapor Barrier Property)

On the surface of gas barrier layer (also referred to as a ceramic layer surface) of each of Gas barrier films 1 to 17, which had been subjected to 100 times repeated bending treatment at an angle of 180° to form a curvature radius of 10 mm in advance, metallic calcium was vacuum evaporated using a vacuum evaporation apparatus (Vacuum evaporation apparatus JEE-400 produced by JEOL Co., Ltd.) on the barrier film sample before a transparent conductive film was formed, while masking other than the portions to be evaporated (9 portions of the size 12 mm×12 mm).

After that, the mask was removed while the vacuum was maintained, and aluminum was evaporated from another metal evaporation source onto entire surface of one side. After the aluminum sealing, the vacuum state was released, and, promptly, the aluminum sealed surface was faced with a quartz glass plate having a thickness of 0.2 mm through a UV curable resin for sealing (produced by Nagase ChemteX Corporation) under a dried nitrogen atmosphere, followed by being irradiated with ultraviolet light. The evaluation cells were thus prepared.

In order to confirm the change in gas barrier property before and after the bending, evaluation cells for water vapor barrier property were prepared also using gas barrier films which were not subjected to bending.

The obtained samples were stored under a high temperature-high humidity condition of 60° C. and 90% RH, and the amount of water permeated into the cell was calculated from the amount of corrosion of metallic calcium according to the method described in JP-A No. 2005-283561.

In order to confirm that there is no moisture permeation from a surface other than the barrier film surface, a sample in which metallic calcium was vacuum evaporated on a 0.2 mm thick quartz glass plated instead of the barrier film was stored under the same high temperature-high humidity condition of 600° C. and 90% RH, as a comparative sample, to confirm that there was no corrosion of metallic calcium even after 1000 hours.

The water vapor permeation rate of each of Gas barrier films 1 to 17 was evaluated in the following 5 stage ranks.

Obtained results were listed in Table 2.

5: less than $5\times10^{-5}$ g/(m²·24 h)
4: $5\times10^{-5}$ g/(m²·24 h) or more but less than $1\times10^{-4}$ g/(m²·24 h)
3: $1\times10^{-4}$ g/(m²·24 h) or more but less than $1\times10^{-3}$ g/(m²·24 h)
2: $1\times10^{-3}$ g/(m²·24 h) or more but less than $1\times10^{-2}$ g/(m²·24 h)
1: $1\times10^{-2}$ g/(m²·24 h) or more Among the above evaluation ranks, Rank 2 or higher meet practically usable levels while Rank 1 corresponds to a practically unusable level.

<<Bending Endurance Test>>

Each of Gas barrier films 1 to 17 was repeatedly bent 100 times at an angle of 180° to form a curvature radius of 20 mmφ while the surface having the gas barrier layer was on the outside.

Then, at the time of measurement of the water vapor permeation rate which will be mentioned later, presence or non-presence of generation of cracks was visually observed from the corrosion situation of metallic calcium, and the ranking evaluation according to the following 3 stages of ranks was conducted.

A: No corroded state looks as cracks was observed.

B: Corroded state looks as minute crack was observed.

C: Corroded state of a large area looks as obvious cracks was observed.

Preparations of gas barrier layers and silanol-containing layers of Gas barrier films 1 to 17 were listed in Tables 1 and 2, and subsequently, the evaluation of the gas barrier properties (water vapor permeation rates) and the bending endurances (also referred to as cracking resistance) of Gas barrier films 1 to 17 were listed in following Table 2.

TABLE 1

| Gas barrier film No. | Substrate | Gas barrier layer 3a (*2) | | | Silanol-containing layer 2 or 2a | | | | |
|---|---|---|---|---|---|---|---|---|---|
| | | Formation | Film forming method | Oxidation treatment | Film thickness nm | Film forming method | Oxidation treatment (*3) | Film thickness nm | SiOH ionic strength | Presence of concentration gradation (*5) |
| 1 | Polyester film | no | — | — | — | Coating | Heating | 200 | 1.00 | no |
| 2 | Composite material (*1) | no | — | — | — | Coating | Heating | 200 | 1.00 | no |
| 3 | Polyester film | yes | Coating | O₂AGP | 60 | Coating | Heating | 200 | 0.80 | no |
| 4 | Polyester film | no | — | — | — | Coating | O₂AGP | 200 | 0.55 | yes |
| 5 | Polyester film | yes | Coating | O₂AGP | 60 | Coating | O₂AGP | 200 | 0.55 | yes |
| 6 | Polyester film | yes | Coating | O₂AGP | 60 | Coating | O₂AGP | 200 | 0.40 | yes |
| 7 | Polyester film | yes | Coating | O₂AGP | 60 | Coating | H₂AGP | 200 | 0.70 | yes |
| 8 | Polyester film | yes | Coating | O₂AGP | 60 | Coating | O₂AGP | 200 | 0.02 | yes |
| 9 | Polyester film | yes | Coating | O₂AGP | 60 | Coating | UV ozone (*7) | 140 | 0.35 | yes |
| 10 | Polyester film | no | — | — | — | Coating | UV ozone (*7) | 140 | 0.45 | yes |
| 11 | Polyester film | yes | Coating | O₂AGP | 60 | Coating | UV ozone (*7) | 140 | 0.35 | yes |
| 12 | Polyester film | yes | Coating | O₂AGP | 60 | Coating | Xe excimer | 140 | 0.30 | yes |
| 13 | Polyester film | yes | Coating | O₂AGP | 60 | Coating | UV ozone (*7) | 140 | 0.35 | yes |
| 14 | Polyester film | no | — | — | — | — | — | — | 0.008 (*6) | — |
| 15 | Polyester film | no | — | — | — | — | — | — | 0.009 (*6) | — |
| 16 | Polyester film | no | — | — | — | Coating | Heating (*4) | 200 | 1.40 | no |
| 17 | Polyester film | no | — | — | — | Coating | Xe excimer | 140 | 0.30 | yes |

(*1): Composite material was prepared by adhering aluminum foil and polyester film
(*2): Indicating a second gas barrier layer provided between the substrate and Silanol-containing layer 2 or 2a
(*3): Heating (60° C., 90% RH, 3 hours), O₂AGP (Oxygen plasma), H₂AGP (Hydrogen plasma), UV ozone (150° C., 30 minutes)
(*4): Heating (60° C., 90% RH, 15 hours)
(*5): Presence or non-presence of concentration gradation in Silanol-containing layer 2 or 2a
(*6): For Films 14 and 15, shown is SiOH ionic strength of Gas barrier layer 3 instead of Silanol-containing layer 2a
(*7): Low pressure mercury lamp was used for UV ozone oxidation treatment

TABLE 2

| Gas barrier film No. | Gas barrier layer 3 (*1) | | | | Gas barrier layer 3b (*3) | | | Evaluation of gas barrier property, Water vapor permeation rate | | Cracking resistance Bending test | Remarks |
|---|---|---|---|---|---|---|---|---|---|---|---|
| | Film forming method | Layer forming method | Oxidation treatment | Film thickness nm | Film forming method | Oxidation treatment | Film thickness nm | Before bending | After bending | | |
| 1 | Coating | — | UV OZONE (*7) | 60 | — | — | — | 2 | 2 | A | Inv. |
| 2 | Coating | — | UV OZONE (*7) | 60 | — | — | — | 2 | 2 | A | Inv. |
| 3 | Coating | — | UV OZONE (*7) | 60 | — | — | — | 2 | 2 | A | Inv. |
| 4 | Coating | — | UV OZONE (*7) | 60 | — | — | — | 3 | 3 | A | Inv. |
| 5 | Coating | — | UV OZONE (*7) | 60 | — | — | — | 3 | 3 | A | Inv. |
| 6 | Coating | — | UV OZONE (*7) | 60 | — | — | — | 3 | 3 | A | Inv. |
| 7 | Coating | — | UV OZONE (*7) | 60 | — | — | — | 3 | 3 | A | Inv. |
| 8 | Coating | — | UV OZONE (*7) | 60 | — | — | — | 3 | 3 | B | Inv. |
| 9 | — | (*2) | UV OZONE (*7) | 60 | — | — | — | 3 | 3 | A | Inv. |
| 10 | — | (*2) | UV OZONE (*7) | 60 | Coating | UV OZONE (*7) | 60 | 4 | 4 | A | Inv. |
| 11 | — | (*2) | UV OZONE (*7) | 60 | Coating | UV OZONE (*7) | 60 | 4 | 4 | A | Inv. |
| 12 | — | (*2) | Xe excimer | 60 | Coating | Xe excimer | 60 | 4 | 4 | A | Inv. |
| 13 | — | (*2) | UV OZONE (*7) | 60 | Coating | O₂AGP | 60 | 4 | 4 | A | Inv. |

TABLE 2-continued

| Gas barrier film No. | Gas barrier layer 3 (*1) | | | | Gas barrier layer 3b (*3) | | | Evaluation of gas barrier property, Water vapor permeation rate | | Cracking resistance Bending test | Remarks |
|---|---|---|---|---|---|---|---|---|---|---|---|
| | Film forming method | Layer forming method | Oxidation treatment | Film thickness nm | Film forming method | Oxidation treatment | Film thickness nm | Before bending | After bending | | |
| 14 | Coating | — | UV OZONE (*7) | 200 | — | — | — | — (*8) | — (*8) | — (*8) | Comp. |
| 15 | Coating | — | Heating (*6) | 200 | — | — | — | 1 | 1 | C | Comp. |
| 16 | Coating | — | UV OZONE (*7) | 60 | — | — | — | 1 | 1 | A | Comp. |
| 17 | — | (*2) | Xe excimer | 60 | Coating | Xe excimer | 60 | 5 | 5 | A | Inv. |

Inv.: Inventive Sample,
Comp.: Comparative Sample,
(*1): Gas barrier 3 prepared on Silanol-containing layer 2 or 2a
(*2): Prepared by oxidation treatment carried out on surface of Silanol-containing layer 2 or 2a
(*3): Gas barrier layer formed on Gas barrier layer 3,
(*6): Heating treatment (150° C., in air, 30 minutes)
(*7): Low pressure mercury lamp was used for UV ozone oxidation treatment
(*8): Not evaluable due to generation of cracking on entire surface when prepared gas barrier film was observed by microscope It is clear from Tables 1 and 2 that, when compared with the comparative Gas barrier films 14 to 16, each of Gas barrier films 1 to 13 and 17 of the present invention shows a high gas barrier property (a low water vapor permeation rate), and an excellent bending endurance (cracking resistance).

Example 2

Gas barrier films 1 to 17 each having been subjected to 50 times repeated bending at an angle of 180° to form a curvature radius of 10 mm, and Gas barrier films 1 to 17 each having not been subjected to the above bending were prepared, and, then, both Gas barrier films 1 to 17 each having a transparent conductive film described below were prepared. Using Gas barrier films 1 to 17 each having been subjected the bending treatment and Gas barrier films 1 to 17 each having not been subjected to the bending treatment, each set of Organic photoelectric conversion elements 1 to 17 were prepared.

<<Manufacturing of Gas Barrier Films 1 to 17 Having been Subjected to Bending Treatment and Those Having not been Subjected to Bending Treatment Each Having a Transparent Conductive Film>>

Using a plasma discharge apparatus having parallel plate type electrodes, thin film formation was carried out by mounting each transparent film between the electrodes and introducing a mixed gas.

The grounded electrode was prepared as follows: A stainless steel plate of 200 mm×200 mm×2 mm was covered by a high density and adhesive alumina thermal sprayed layer and coated with a solution prepared by diluting tetramethoxysilane with ethyl acetate and dried. And, then, the coated layer was cured by UV irradiation, whereby pinhole filling treatment was conducted. Thus obtained surface of the dielectric substance covering layer was polished for smoothing so that the maximum surface roughness $R_{max}$ was made to 5 μm. Thus prepared electrode was used.

The electric power applying electrode which was composed of a square columnar hollow pipe made of pure titanium, which was covered with the same dielectric material as that used for the grounded electrode, was used. Plural electric power applying electrodes were prepared and placed facing to the grounded electrode to form a discharging space.

As the electric source for generating plasma, employed was an electric power of 5 W/cm² at 13.56 MHz supplied by the high frequency power source CF-5000-13M, manufactured by Pearl Industry Co., Ltd.

A mixed gas having the following composition was flowed between the electrodes to make a plasma state. On each film of Gas barrier films 1 to 17 each having been subjected the bending treatment and Gas barrier films 1 to 17 each having not been subjected to the bending treatment, as prepared in Example 1, a tin-doped indium oxide (ITO) layer having a thickness 150 nm was formed using the plasma state. Thus, Gas barrier films 1 to 17 (including both sets of having been subjected to the bending treatment and having not been subjected to the bending treatment) each having a transparent conductive film were prepared.
(Plasma Generating Condition)
　　Discharging gas: Helium, 98.5% by volume
　　Reactive gas 1: Oxygen, 0.25% by volume
　　Reactive gas 2: indium acetylacetonate, 1.2% by volume
　　Reactive gas 3: dibutyl tin acetate, 0.05% by volume
<<Manufacturing of Organic Photoelectric Conversion Elements 1 to 17>>

On each of Gas barrier films 1 to 17 (including both sets of having been subjected to the bending treatment and having not been subjected to the bending treatment) each having a transparent conductive film (having a thickness of 150 nm and a sheet resistance of 10Ω/□), a first electrode was formed by patterning in 2 mm width using a usual photolithography technique and wet etching.

The patterned first electrode (anode) was washed via sequential steps of ultrasonic washing using a surfactant and ultra pure water and ultrasonic washing using ultra pure water, followed by drying under a nitrogen flow, and, finally, cleaned via ultraviolet/ozone cleaning. Transparent substrates 1 to 17 of each set were thus obtained.

On each surface of obtained Transparent substrates 1 to 17 of each set, Baytron P4083 (produced by Starck Vitec, Co.) was applied and then dried to obtain a layer thickness of 30 nm, subsequently, the layer was subjected to a heat treatment at 150° C. for 30 minutes to form a positive hole transport layer.

After that, each substrate was carried into a nitrogen chamber and preparation was carried out under a nitrogen atmosphere.

First, the above-mentioned substrate was heat-treated for 10 minutes at 1500° C. under a nitrogen atmosphere. Then, a liquid obtained by mixing, in chlorobenzene, 3.0% by mass of 1:0.8 mixture of P3HT (produced by Plectronics, Inc.: regio-regular-poly-3-hexylthiophene) and PCBM (produced by Frontier Carbon Corporation: 6,6-phenyl-$C_{61}$-butyric acid methyl ester) was prepared, and then applied onto the resulting substrate, while filtering with a filter, so that the thickness was 100 nm, followed by drying while leaving at an ambient temperature. Subsequently, a heat treatment at 150° C. for 15 minutes was conducted, whereby a photoelectric conversion layer was formed.

Next, the substrate on which the aforementioned series of function layers were formed was moved into the chamber of a vacuum evaporation apparatus, and, after the inside of the vacuum evaporation apparatus was evacuated to $1 \times 10^{-4}$ Pa or less, lithium fluoride was accumulated to a thickness of 0.6 nm at an evaporation rate of 0.01 nm/sec, and, subsequently, metallic Al was accumulated to a thickness of 100 nm at an evaporation rate of 0.2 nm/sec through a shadow mask having a width of 2 mm (vacuum evaporation was conducted by orthogonally crossing the masks so that the photo receiving portion became 2×2 mm), whereby a second electrode was formed.

Obtained Organic photoelectric conversion elements 1 to 17 of each set were transferred to a nitrogen chamber, and sealing was conducted according to the following sealing method. Thus, Organic photoelectric conversion elements 1 to 17 of each set, each element having 2×2 mm photo receiving portions were prepared.

(Sealing of Organic Photoelectric Conversion Elements 1 to 17)

Under a circumstance purged by a nitrogen gas (an inert gas), two sheets of gas barrier films which were the same as that used for the substrate were applied with an epoxy-photocurable adhesive as a sealant on the surface on which the gas barrier layer. The above described organic photoelectric conversion element was sandwiched between the two gas barrier films while the surfaces having the gas barrier layer were arranged inside, and the gas barrier films were tightly adhered. Then, the organic photoelectric conversion element was irradiated with UV light from the substrate side of one side for hardening.

As described above, Organic photoelectric conversion elements 1 to 17 (including both sets of having been subjected to the bending treatment and having not been subjected to the bending treatment).

<<Durability Evaluation of Organic Photoelectric Conversion Elements 1 to 17>>.

(Evaluation of Energy Conversion Efficiency)

Each of Organic photoelectric conversion elements 1 to 17 was irradiated with light of 100 mW/cm² from a solar simulator (AM 1.5 G filter). By evaluating an I-V property while placing a mask having an effective area of 4.0 mm² on the photo receiving portion, a short circuit current density Jsc (mA/cm²), an open circuit voltage Voc (V) and a fill factor FF (%) were determined to evaluate the energy conversion efficiency PCE(%) calculated according to following Formula 1 for each of the four photo receiving portions formed on the same element. Then, an average of the above four energy conversion efficiencies was estimated.

$$PCE(\%) = [Jsc(mA/cm^2) \times Voc(V) \times FF(\%)]/100 \text{ mW/cm}^2. \quad \text{Formula 1}$$

The energy conversion efficiency as an initial cell property was measured, and then the degree of time degradation of the property was evaluated from the residual ratio of the energy conversion efficiency after an enforced degradation test in which the element was stored at 60° C. under 90% RH for 1000 hours.

The ratio of
energy conversion efficiency after enforced degradation test/initial energy conversion efficiency was evaluated.

With respect to the photoelectric conversion efficiency, evaluation was conducted on the barrier films which were subjected to the above bending treatment.

5: 80% or more
4: 70% or more, but less than 80%
3: 40% or more, but less than 70%
2: 20% or more, but less than 40%
1: less than 20%

The obtained results were listed in Table 3.

TABLE 3

| Organic photoelectric conversion element No. | Gas barrier film No. | Durability evaluation Before bending | After bending | Remarks |
|---|---|---|---|---|
| 1 | 1 | 2 | 2 | Inventive Sample |
| 2 | 2 | 3 | 3 | Inventive Sample |
| 3 | 3 | 3 | 3 | Inventive Sample |
| 4 | 4 | 2 | 2 | Inventive Sample |
| 5 | 5 | 3 | 3 | Inventive Sample |
| 6 | 6 | 3 | 3 | Inventive Sample |
| 7 | 7 | 3 | 3 | Inventive Sample |
| 8 | 8 | 2 | 2 | Inventive Sample |
| 9 | 9 | 4 | 4 | Inventive Sample |
| 10 | 10 | 3 | 3 | Inventive Sample |
| 11 | 11 | 4 | 4 | Inventive Sample |
| 12 | 12 | 4 | 4 | Inventive Sample |
| 13 | 13 | 4 | 4 | Inventive Sample |
| 14 | 14 | —(*1) | —(*1) | Comparative Sample |
| 15 | 15 | 1 | 1 | Comparative Sample |
| 16 | 16 | 1 | 1 | Comparative Sample |
| 17 | 17 | 5 | 5 | Inventive Sample |

(*1)Not evaluable

It is clear from Table 3 that, when compared with the comparative Organic photoelectric conversion elements 14 to 16, each of Organic photoelectric conversion elements 1 to 13 and 17 of the present invention shows a remarkably superior photoelectric conversion efficiency of the organic photoelectric conversion element.

DESCRIPTION OF REFERENCE NUMERALS

1 Substrate
1a Substrate which is a composite film obtained by adhering an aluminum foil and polyester
2 Silanol-containing Layer
2a Silanol layer having an inclination of the silanol groups in the layer
3 Gas Barrier Layer prepared on a silanol-containing layer
3a A second gas barrier layer provided between the substrate and a silanol-containing layer
3b Gas barrier layer provided on Gas barrier layer 3
10 Organic photoelectric conversion element of a bulk heterojunction type
11 Substrate
12 Anode
13 Cathode
14 Power generation layer (bulk heterojunction layer)
14p p layer
14i i layer
14n n layer
14' First power generation layer
15 Charge recombination layer
16 Second power generation layer
17 Positive hole transport layer
18 Electron transport layer

What is claimed is:

1. A gas barrier film comprising a substrate having thereon at least one silanol-containing layer and at least one gas barrier layer in that order, the gas barrier layer containing silicon atoms and oxygen atoms, wherein
   a relative SiOH ionic strength detected from a central portion of the silanol-containing layer with respect to the depth direction thereof is from 0.2 to 1.0, provided that a relative Si ionic strength is set to 1.0, the relative SiOH ionic strength and the relative Si ionic strength being detected via time-of-flight secondary ion mass spectroscopy (Tof-SIMS).

2. The gas barrier film of claim 1, wherein the relative SiOH ionic strength is from 0.2 to 0.8.

3. The gas barrier film of claim 1, wherein the relative SiOH ionic strength is from 0.3 to 0.6.

4. The gas barrier film of claim 1, wherein the gas barrier film comprises a second gas barrier layer between the substrate and the silanol-containing layer.

5. The gas barrier film of claim 1, wherein the substrate comprises a plastic film.

6. The gas barrier film of claim 1, wherein a rate of water vapor permeation is $10^{-4}$ g/(m$^2$·24 h) or less, and a rate of oxygen permeation is 0.01 ml/(m$^2$·0.1 MPa/day) or less.

7. A The gas barrier film of claim 1, wherein a rate of water vapor permeation is $10^{-5}$ g/(m$^2$·24 h) or less, and a rate of oxygen permeation is 0.001 ml/(m$^2$·0.1 MPa/day) or less.

8. A method of manufacturing a gas barrier film of claim 1, wherein at least one of the silanol-containing layer and the gas barrier layer is prepared through a step of applying a liquid containing a silicon compound.

9. The method of claim 8, wherein the silanol-containing layer is prepared through a step of applying a liquid containing a silicon compound.

10. The method of claim 8, wherein the gas barrier layer is prepared through a step of applying a liquid containing a silicon compound.

11. The method of claim 8, wherein the silanol-containing layer or the gas barrier layer is prepared via an ultraviolet light irradiation treatment carried out on a film obtained by applying the liquid containing a silicon compound from a surface side of the film obtained by applying the liquid containing the silicon compound.

12. A method of manufacturing a gas barrier film of claim 1, wherein the silanol-containing layer or the gas barrier layer is prepared via an ultraviolet light irradiation treatment carried out on a film obtained by applying a liquid containing a silicon compound from a surface side of the film obtained by applying the liquid containing the silicon compound.

13. An organic photoelectric conversion element comprising the gas barrier film of claim 1.

* * * * *